US 12,484,406 B2

(12) United States Patent
Cho et al.

(10) Patent No.: US 12,484,406 B2
(45) Date of Patent: Nov. 25, 2025

(54) DISPLAY APPARATUS

(71) Applicant: Samsung Display Co., Ltd., Yongin-si (KR)

(72) Inventors: Youngjin Cho, Yongin-si (KR); Minjeong Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 399 days.

(21) Appl. No.: 18/309,380

(22) Filed: Apr. 28, 2023

(65) Prior Publication Data

US 2024/0122007 A1 Apr. 11, 2024

(30) Foreign Application Priority Data

Oct. 11, 2022 (KR) .................. 10-2022-0129752

(51) Int. Cl.
| | |
|---|---|
| H10K 59/131 | (2023.01) |
| G09F 9/33 | (2006.01) |
| H10D 86/40 | (2025.01) |
| H10D 86/60 | (2025.01) |
| H10K 50/805 | (2023.01) |
| H10K 59/12 | (2023.01) |
| H10K 59/121 | (2023.01) |

(52) U.S. Cl.
CPC ....... *H10K 59/131* (2023.02); *H10K 59/1213* (2023.02); *H10K 59/1216* (2023.02)

(58) Field of Classification Search
CPC ............ H10K 59/131; H10K 59/1213; H10K 59/1216; H10K 50/805; H10D 86/441; H10D 86/60; G09F 9/335
See application file for complete search history.

(56) References Cited

U.S. PATENT DOCUMENTS

| | | | |
|---|---|---|---|
| 11,545,537 B2 | 1/2023 | Lee et al. | |
| 2005/0128416 A1* | 6/2005 | Hashimoto | G02F 1/1339 349/149 |
| 2014/0319528 A1* | 10/2014 | Kesho | H10D 86/443 257/59 |
| 2021/0028258 A1* | 1/2021 | Lee | H10K 59/131 |
| 2021/0043716 A1* | 2/2021 | Jeon | H10K 59/124 |
| 2021/0074783 A1* | 3/2021 | Kang | H10D 30/6743 |
| 2021/0225991 A1* | 7/2021 | Kang | G02F 1/1345 |
| 2021/0265437 A1* | 8/2021 | Son | H10K 59/131 |
| 2021/0351259 A1 | 11/2021 | Lee et al. | |
| 2021/0375215 A1* | 12/2021 | Cho | H10D 86/60 |

(Continued)

FOREIGN PATENT DOCUMENTS

| | | | |
|---|---|---|---|
| KR | 10-2021-0029339 A | 3/2021 | |
| KR | 10-2021-0137336 A | 11/2021 | |

(Continued)

*Primary Examiner* — Mohsen Ahmadi
(74) *Attorney, Agent, or Firm* — Womble Bond Dickinson (US) LLP

(57) ABSTRACT

A display apparatus includes: a first connection electrode layer on a substrate and comprising a horizontal connection line extending in a first direction; and a second connection electrode layer on the first connection electrode layer, comprising a vertical connection line extending in a second direction crossing the first direction and a driving voltage line extending in the second direction, the driving voltage line comprising a protrusion overlapping the horizontal connection line.

13 Claims, 18 Drawing Sheets

(56) References Cited

U.S. PATENT DOCUMENTS

2021/0391405 A1* 12/2021 Lee .................... H10K 59/1213
2022/0208924 A1* 6/2022 Choi .................... H10D 86/481
2024/0090260 A1* 3/2024 Choi .................. H10K 59/1213

FOREIGN PATENT DOCUMENTS

KR    10-2021-0148547 A    12/2021
KR    10-2021-0155444 A    12/2021

* cited by examiner

DISPLAY APPARATUS

CROSS-REFERENCE TO RELATED APPLICATION

The present application claims priority to and the benefit of Korean Patent Application No. 10-2022-0129752, filed on Oct. 11, 2022, in the Korean Intellectual Property Office, the entire disclosure of which is incorporated herein by reference.

BACKGROUND

1. Field

Aspects of one or more embodiments relate to a display apparatus.

2. Description of the Related Art

Generally, in a display apparatus such as an organic light-emitting display apparatus, thin-film transistors are respectively arranged in (sub-)pixels to control the brightness, etc. of the (sub-)pixels. Such thin-film transistors control the brightness, etc. of their corresponding (sub-) pixels according to transmitted data signals or the like.

The data signals are transmitted to respective (sub-)pixels through data lines from a driver located in a peripheral area on an outer side of a display area.

The above information disclosed in this Background section is only for enhancement of understanding of the background and therefore the information discussed in this Background section does not necessarily constitute prior art.

SUMMARY

Aspects of one or more embodiments relate to a display apparatus, and for example, to a display apparatus capable of displaying high-quality images.

In a display apparatus, when an area of a region where a driver, etc. are arranged is large or when the area is reduced, the quality of images displayed in a display area may degrade.

Aspects of some embodiments include a display apparatus that may address the above-described issues, and may be capable of displaying relatively high-quality images. However, this is merely an example, and the scope of embodiments according to the present disclosure is not limited thereto.

Additional aspects will be set forth in part in the description which follows and, in part, will be apparent from the description, or may be learned by practice of the presented embodiments of the disclosure.

According to one or more embodiments, a display apparatus includes a first connection electrode layer on a substrate and including a horizontal connection line extending in a first direction, and a second connection electrode layer on the first connection electrode layer, including a vertical connection line extending in a second direction crossing the first direction and a driving voltage line extending in the second direction, the driving voltage line including a protrusion overlapping the horizontal connection line.

According to some embodiments, the driving voltage line may include a first driving voltage branch extending in the second direction, a second driving voltage branch extending in the second direction and arranged apart from the first driving voltage branch in the first direction, and a driving voltage body connected to the first driving voltage branch and the second driving voltage branch.

According to some embodiments, the protrusion may protrude from the driving voltage body in the second direction to be arranged between the first driving voltage branch and the second driving voltage branch.

According to some embodiments, the protrusion may include a first protrusion which has one end connected to the driving voltage body and extends in the second direction and a second protrusion connected to the other end of the first protrusion and extending in the first direction.

According to some embodiments, the second protrusion may overlap the horizontal connection line.

According to some embodiments, the driving voltage line may include a plurality of driving voltage bodies arranged in the second direction, a plurality of first driving voltage branches extending in the second direction and arranged between the plurality of driving voltage bodies to connect the plurality of driving voltage bodies to each other, and a plurality of second driving voltage branches arranged apart from the plurality of first driving voltage branches in the first direction, wherein each of the plurality of second driving voltage branches has an end connected to a corresponding one of the plurality of driving voltage bodies.

Another end of each of the plurality of second driving voltage branches may be spaced apart from the plurality of driving voltage bodies.

According to some embodiments, the second connection electrode layer may further include connection electrodes arranged apart from the driving voltage line, each of the connection electrodes including a portion arranged between the another end of a corresponding one of the plurality of second driving voltage branches and a corresponding one of the plurality of driving voltage bodies.

According to some embodiments, the display apparatus may further include pixel electrodes on the second connection electrode layer, each of the pixel electrodes being electrically connected to a corresponding one of the connection electrodes through a contact hole.

According to one or more embodiments, a display apparatus includes a first semiconductor layer on a substrate, a first gate layer on the first semiconductor layer and including a driving gate electrode, a second gate layer on the first gate layer and including an initialization gate line extending in a first direction, a second semiconductor layer on the second gate layer and including a $2^{nd}$-$1^{st}$ semiconductor layer extending in a second direction crossing the first direction and a semiconductor extension layer extending from the $2^{nd}$-$1^{st}$ semiconductor layer in the first direction, a first connection electrode layer on the second semiconductor layer and including a horizontal connection line extending in the first direction and comprising a portion overlapping the semiconductor extension layer, and a second connection electrode layer on the first connection electrode layer and including a vertical connection line extending in the second direction and a driving voltage line extending in the second direction.

According to some embodiments, the first gate layer may further include an initialization voltage line extending in the first direction, and the semiconductor extension layer is electrically connected to the initialization voltage line.

According to some embodiments, the first connection electrode layer may further include a connection electrode connected to the initialization voltage line and the semiconductor extension layer through contact holes.

According to some embodiments, the $2^{nd}$-$1^{st}$ semiconductor layer and the semiconductor extension layer may be integrally formed as a single body and include oxide semiconductor materials.

According to some embodiments, the second semiconductor layer may further include a $2^{nd}$-$2^{nd}$ semiconductor layer extending in the second direction, an end of the semiconductor extension layer may be connected to the $2^{nd}$-$1^{st}$ semiconductor layer, and the other end of the semiconductor extension layer may be connected to the $2^{nd}$-$2^{nd}$ semiconductor layer.

According to some embodiments, a portion of the horizontal connection line, which overlaps the semiconductor extension layer, may be located in the semiconductor extension layer, when viewed in a direction perpendicular to the substrate.

According to one or more embodiments, a display apparatus includes a first semiconductor layer on a substrate, a first gate layer on the first semiconductor layer and including a driving gate electrode and a bias gate line extending in a first direction, a second gate layer on the first gate layer and including an initialization gate line extending in the first direction, a third gate layer on the second gate layer and including a bias voltage line extending in the first direction and overlapping the bias gate line, a first connection electrode layer on the third gate layer and including a horizontal connection line extending in the first direction, and a second connection electrode layer on the first connection electrode layer and including a vertical connection line extending in a second direction and a driving voltage line extending in the second direction.

According to some embodiments, the first connection electrode layer may further include a connection electrode connected to the bias voltage line and the first semiconductor layer through contact holes.

Other aspects, features, and characteristics other than those described above will become more apparent from the following detailed description, claims and drawings for carrying out the disclosure.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
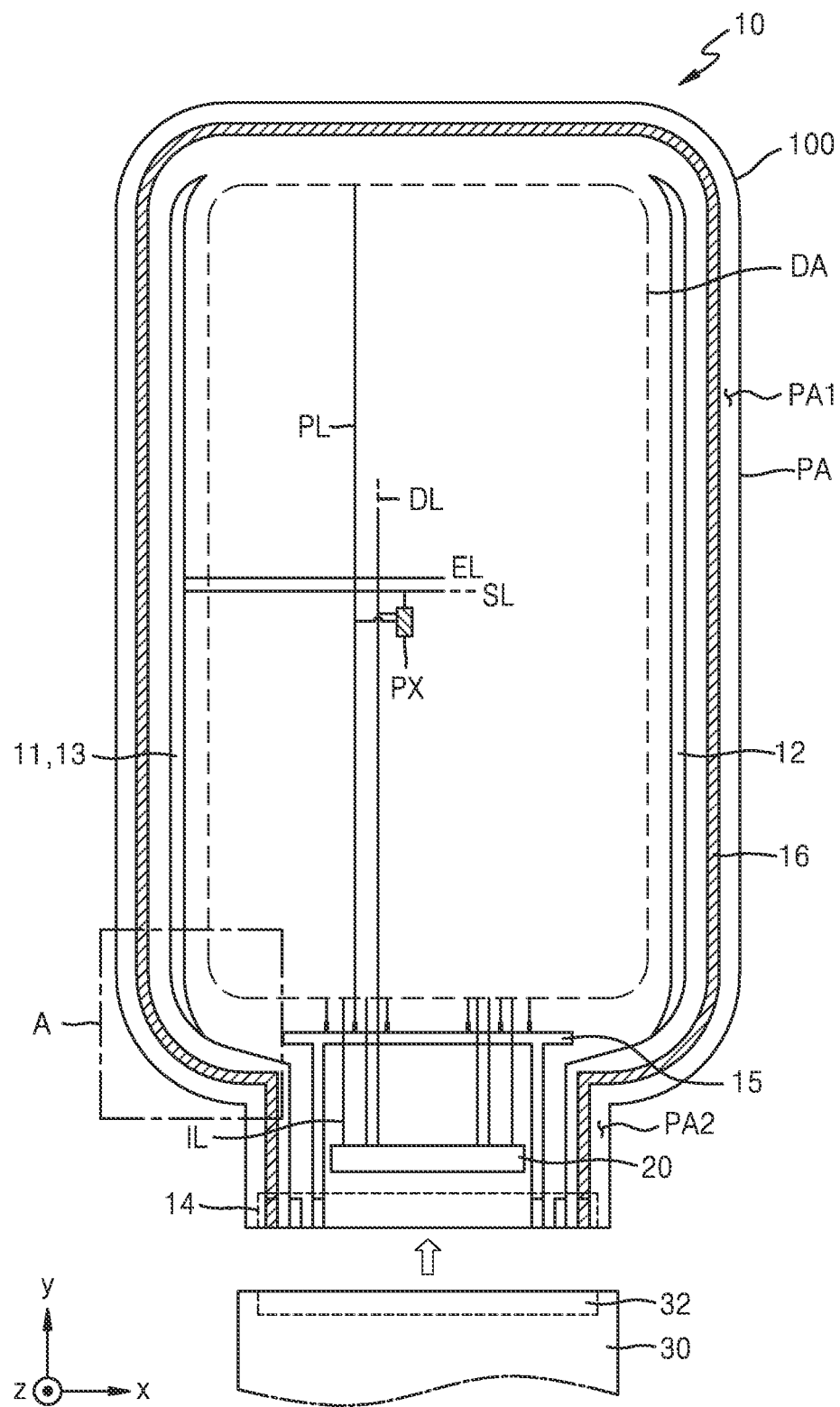
FIG. 1 is a schematic plan view of a portion of a display apparatus according to some embodiments.

Reference will now be made in more detail to aspects of some embodiments, which are illustrated in the accompanying drawings, wherein like reference numerals refer to like elements throughout. In this regard, embodiments according to the present disclosure may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

As the disclosure allows for various changes and numerous embodiments, particular embodiments will be shown in the drawings and described in detail in the written description. The attached drawings for illustrating preferred embodiments of the present disclosure are referred to in order to gain a sufficient understanding of the present disclosure, the merits thereof, and the objectives accomplished by the implementation of the present disclosure. The disclosure may, however, be embodied in many different forms and should not be construed as being limited to the embodiments set forth herein.

Hereinafter, one or more embodiments of the disclosure will be described in more detail with reference to the accompanying drawings. Like elements in the drawings denote like elements, and repeated descriptions thereof are omitted, It will be understood that when a component, such as a layer, a film, a region, or a plate, is referred to as being "on" another component, the component can be directly on the other component or intervening components may be present thereon. Sizes of components in the drawings may be exaggerated for convenience of explanation. In other words, since sizes and thicknesses of elements in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic plan view of a portion of a display apparatus according to some embodiments. As shown in FIG. 1, the display apparatus includes a display panel 10. The display apparatus including the display panel 10 may be any type of display apparatus. For example, the display apparatus may be various products such as a smartphone, a tablet computer, a laptop, a television, or a billboard.

The display panel 10 includes a display area DA and a peripheral area PA at outside (e.g., in a periphery) of the display area DA. The display area DA is an area where images are displayed, and a plurality of pixels may be arranged therein. When viewed in a direction substantially perpendicular or normal to the display panel 10 (e.g., in a plan view), the display area DA may have various shapes such as a circle, an oval, a polygon, and other specific shapes. FIG. 1 shows that the shape of the display area DA is substantially a rectangle with rounded edges, but embodiments according to the present disclosure are not limited thereto.

The peripheral area PA may be located over the outer side of the display area DA. The peripheral area PA may include a first peripheral area PA1 surrounding most of the display area DA (i.e., three edges of the display area DA), and a second peripheral area PA2 arranged on one side of the display area DA (in the −y direction). The second peripheral area PA2 may be adjacent to the first peripheral area PA1. A width of the second peripheral area PA2 (in an x-axis direction) may be less than a width of the display area DA (in the x-axis direction). As described below based on the above structure, at least a portion of the second peripheral area PA2 may be easily bent.

Because the display panel 10 includes a substrate 100, it may be described that a substrate 100 includes the display area DA and the peripheral area PA described above. Hereinafter, for convenience, it is described that the substrate 100 includes the display area DA and the peripheral area PA, The display panel 10 may be bent with respect to a bending axis (in the x-axis direction) in at least a portion of the second peripheral area PA2. When the display panel 10 is bent, a portion of the second peripheral area PA2 may overlap the display area DA when viewed in a z-axis direction. Embodiments according to the present disclosure are not limited to a display apparatus that is bent and may also be applied to a display apparatus that is not bent. The second peripheral area PA2 may be a non-display area. Because the display panel 10 is bent as described above, when the display apparatus is viewed from a front surface (in a −z direction) thereof, a viewed area of the non-display area may decrease even though the non-display area is viewed.

A driving chip 20 may be arranged in the second peripheral area PA2 of the display panel 10. The driving chip 20 may include an integrated circuit for driving the display panel 10. Such an integrated circuit may be a data driving integrated circuit for generating a data signal, but one or more embodiments are not limited thereto.

The driving chip 20 may be mounted in the second peripheral area PA2 of the display panel 10. Although the driving chip 20 is mounted on the same surface as a display surface of the display area DA, because the display panel 10 is bent in the second peripheral area PA2 as described above, the driving chip 20 may be located on a rear surface of the display area DA.

A printed circuit board 30, etc. may be attached to an end of the second peripheral area PA2 of the display panel 10. The printed circuit board 30, etc. may be electrically connected to the driving chip 20, etc. through a pad on the substrate 100.

Hereinafter, an organic light-emitting display apparatus is described as an example of the display apparatus, but the display apparatus is not limited thereto. As another example, the display apparatus may be a display apparatus such as an inorganic light-emitting display apparatus, an inorganic EL display apparatus, or a quantum dot light-emitting display apparatus. For example, an emission layer of a display element of the display apparatus may include an organic material or an inorganic material. Also, the display apparatus may include an emission layer and quantum dots arranged in a path of light emitted from the emission layer.

As described above, the display panel 10 may include the substrate 100. Various components included in the display panel 10 may be located over the substrate 100. The substrate 100 may include a glass material, metals, or polymer resin. As described above, when the display panel 10 is bent in the second peripheral area PA2, the substrate 100 needs to be flexible or bendable. In this case, the substrate 100 may include polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. Various modifications may be made to the substrate 100, and for example, the substrate 100 may have a multilayered structure that includes two layers including the above polymer resin and a barrier layer including an inorganic material (silicon oxide, silicon nitride, silicon oxynitride, or the like) and arranged between the two layers.

In the display area DA, pixels PX are arranged. Each of the pixels PX may be a sub-pixel and include a display element such as an organic light-emitting diode OLED and a pixel circuit electrically connected to the display element. The pixel PX may emit, for example, red light, green light, blue light, or white light. The pixels PX may be electrically connected to outer circuits arranged in the peripheral area PA. In the peripheral area PA, a first scan driving circuit 11, a second scan driving circuit 12, an emission control driving circuit 13, a terminal 14, a driving voltage supply line 15, and a common voltage supply line 16 are arranged.

The first scan driving circuit 11 may provide a scan signal to the pixel PX through a scan line SL. The second scan driving circuit 12 may be arranged side by side with the first scan driving circuit 11 with the display area DA therebetween. Some of the pixels PX arranged in the display area DA may be electrically connected to the first scan driving circuit 11, and the others of the pixels PX may be connected to the second scan driving circuit 12. According to necessity, the second scan driving circuit 12 may be omitted, and all of the pixels PX arranged in the display area DA may be electrically connected to the first scan driving circuit 11.

The emission control driving circuit 13 may be arranged on a side of the first scan driving circuit 11 and configured to provide an emission control signal to the pixel PX through an emission control line EL. FIG. 1 shows that the emission control driving circuit 13 is arranged only on a side of the display area DA, but the emission control driving circuit 13 may be arranged on both sides of the display area DA like the first scan driving circuit 11 and the second scan driving circuit 12.

The terminal 14 may be arranged in the second peripheral area PA2 of the substrate 100. The terminal 14 may not be covered by an insulating layer and be exposed, thus being electrically connected to the printed circuit board 30. A terminal 32 of the printed circuit board 30 may be electrically connected to the terminal 14 of the display panel 10.

The printed circuit board 30 may be configured to transmit a signal or power from a controller to the display panel 10. Control signals generated in the controller may be transmitted to the driving circuits 11 to 13, respectively, through the printed circuit board 30. Also, the controller may transmit a driving voltage (ELVDD, see FIG. 4) to the driving voltage supply line 15 and a common voltage (ELVSS, see FIG. 4) to the common voltage supply line 16. The driving voltage ELVDD may be transmitted to each pixel PX through a driving voltage line PL connected to the driving voltage supply line 15, and the common voltage ELVSS may be transmitted to an opposite electrode (a common electrode) of the pixel PX connected to the common voltage supply line 16. The driving voltage supply line 15 may have a shape extending in a direction (e.g., the x-axis direction) on a lower side of the display area DA. The common voltage supply line 16 may have a loop shape with one open side and thus partially surround the display area DA.

The controller may generate data signals, and the generated data signals may be transmitted to an input line IL through the driving chip 20 and to the pixel PX through a data line DL connected to the input line IL.

For reference, the term "line" may indicate a "wire," which is also applied to embodiments below and modified examples.

Figure 2:
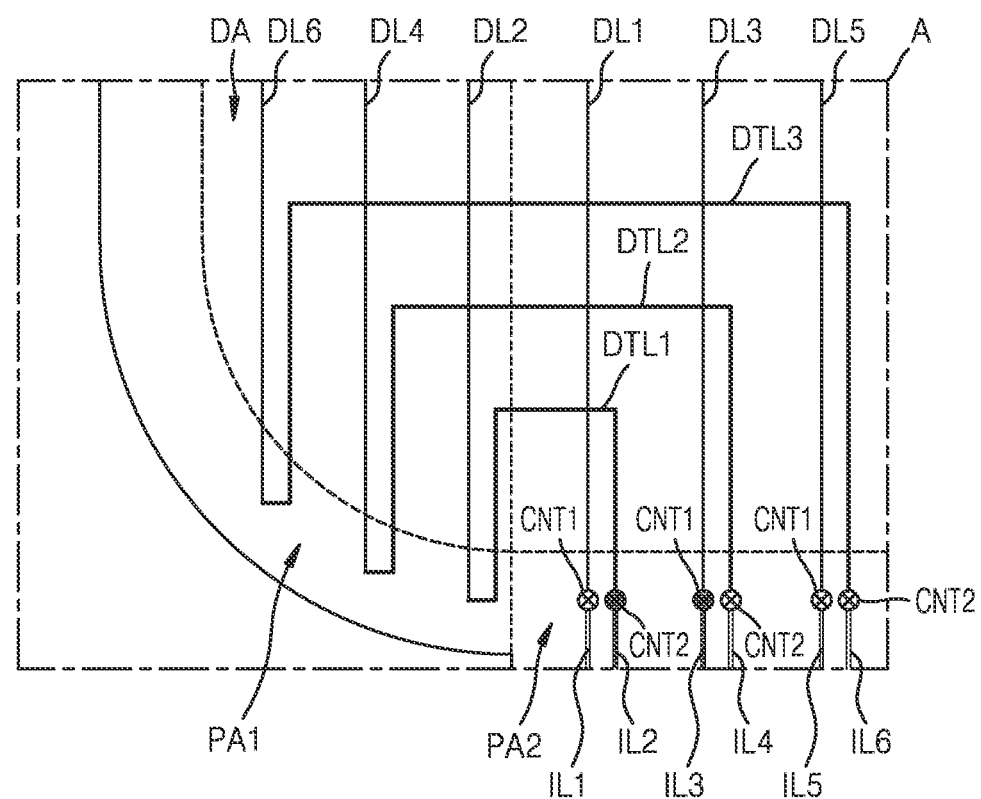
FIGS. 2 and 3 are schematic plan views showing an enlarged view of a portion A of the display apparatus of FIG. 1 according to some embodiments.
Figure 3:
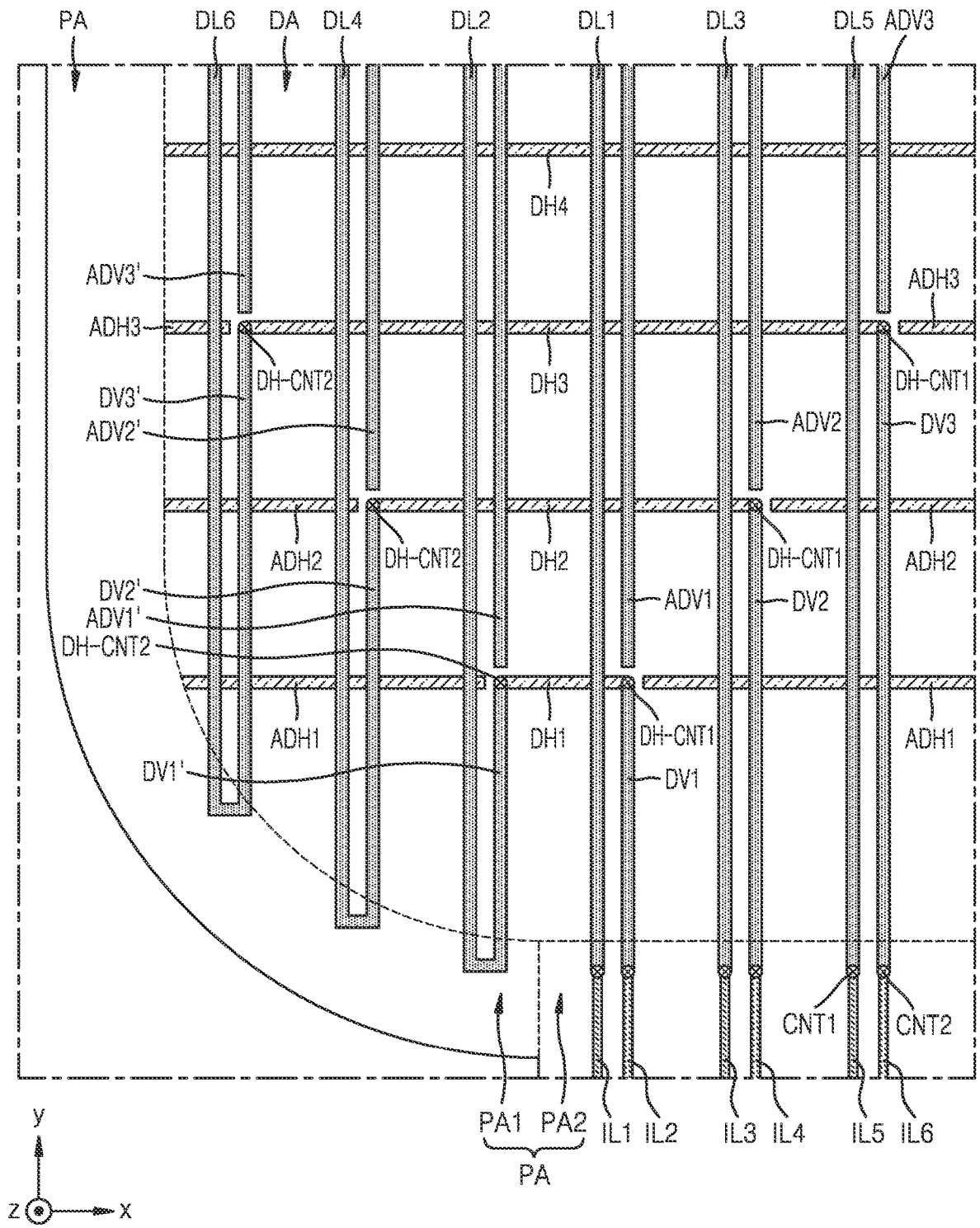

FIGS. 2 and 3 are schematic plan views showing an enlarged view of the portion A of the display apparatus of FIG. 1.

Various signals may be applied to the display area DA. For example, a data signal, etc. for adjusting the brightness of each pixel may be applied to the display area DA. To this end, as shown in FIG. 2, data lines DL1 to DL6, which are arranged in a first direction (the x-axis direction) to be substantially parallel to each other and extend in a second direction (a y-axis direction) crossing the first direction, may be arranged in the display area DA. According to necessity, as shown in FIG. 2, the data lines DL1 to DL6 may have shapes extending from the peripheral area PA to the display area DA. Various lines such as power lines or scan lines other than the data lines DL1 to DL6 may also be arranged in the display area DA.

In the peripheral area PA, specifically, the second peripheral area PA2, a first input line IL1 to a sixth input line IL6 may be located. The first input line IL1 to the sixth input line IL6 may be connected to the driving chip 20 and receive the data signals. The first data line DL1 to the sixth data line DL6 may be electrically connected to the first input line IL1 to the sixth input line IL6, and configured to transmit the data signals to pixels in the display area DA.

In FIGS. 2 and 3, the number of input lines and the number of data lines each are six for convenience of explanation. However, one or more embodiments are not limited thereto, and the number of each of the input lines and the data lines may be greater than or equal to six.

The first input line IL1 to the sixth input line IL6 may be sequentially arranged on an edge of the second peripheral area PA2 (in a direction towards the first peripheral area PA1) in a central direction (a +x direction) of the second peripheral area PA2, According to some embodiments, the first input line IL1, the third input line IL3, and the fifth input line IL5, which are odd-numbered lines, may be electrically connected to the first data line DL, the third data line DL3, and the fifth data line DL5, which are adjacent to each other and continuously arranged. The first input line IL1, the third input line IL3, and the fifth input line IL5 may be integrally formed with corresponding ones among the first data line DL1, the third data line DL3, and the fifth data line DL5, and as shown in FIGS. 2 and 3, the first input line IL1, the third input line IL3, and the fifth input line IL5 may be electrically connected to corresponding ones of the first data line DL1, the third data line DL3, and the fifth data line DL5 through a first contact hole CNT1, respectively. In the latter case, as shown in FIG. 3, the first data line DL1, the third data line DL3, and the fifth data line DL5 may be located over an insulating layer covering the first input line IL1, the third input line IL3, and the fifth input line IL5. The first data line DL1, the third data line DL3, and the fifth data line DL5 may receive the data signals from the first input line IL1, the third input line IL3, and the fifth input line IL5.

As shown in FIG. 2, the second input line IL2, the fourth input line IL4, and the sixth input line IL6, which are even-numbered lines, may be electrically connected to the second data line DL2, the fourth data line DL4, and the sixth data line DL6, which are adjacent to each other and continuously arranged, through a first data transmission line DTL1, a second data transmission line DTL2, and a third data transmission line DTL3. That is, the second data line DL2, the fourth data line DL4, and the sixth data line DL6 may receive the data signals from the second input line IL2, the fourth input line IL4, and the sixth input line IL6 through the first data transmission line DTL1 to the third data transmission line DTL3.

The first data transmission line DTL1 to the third data transmission line DTL3 may be arranged to pass a portion of the display area DA, which is adjacent to the peripheral area PA, that is, the display area DA. The second input line IL2 may be electrically connected to the second data line DL2 through the first data transmission line DTL1, the fourth input line IL4 may be electrically connected to the fourth data line DL4 through the second data transmission line DTL2, and the sixth input line IL6 may be electrically connected to the sixth data line DL6 through the third data transmission line DTL3.

Ends of the first data transmission line DTL1, the second data transmission line DTL2, and the third data transmission line DTL3 may be electrically connected to the second input line IL2, the fourth input line IL4, and the sixth input line IL6, respectively, through a second contact hole CNT2, and the other ends thereof may be respectively connected to the second data line DL2, the fourth data line DL4, and the sixth data line DL6. FIGS. 2 and 3 show that the second contact hole CNT2 is located in the second peripheral area PA2, but one or more embodiments are not limited thereto. For example, the second contact hole CNT2 may be located in the display area DA.

Because of the above structure, the second input line IL2 may be configured to transmit the data signal to the second data line DL2, the fourth input line IL4 may be configured to transmit the data signal to the fourth data line DL4, and the sixth input line IL6 may be configured to transmit the data signal to the sixth data line DL6.

FIG. 3 shows in detail example configurations of the first data transmission line DTL1 to the third data transmission line DTL3.

As described above, the second input line IL2, the fourth input line IL4, and the sixth input line IL6 may be electrically connected to the second data line DL2, the fourth data line DL4, and the sixth data line DL6 through the first data transmission line DTL1, the second data transmission line DTL2, and the third data transmission line DTL3. In this case, the first data transmission line DTL1 may include a first vertical connection line DV1', a first horizontal connection line DH1, and a first additional vertical connection line DV1. Similarly, the second data transmission line DTL2 may include a second vertical connection line DV2', a second horizontal connection line DH2, and a second additional vertical connection line DV2. The third data transmission line DTL3 may include a third vertical connection line DV3' a third horizontal connection line DH3, and a third additional vertical connection line DV3.

The first vertical connection line DV1' to the third vertical connection line DV3' and the first additional vertical connection line DV1 to the third additional vertical connection line DV3 may be arranged substantially in parallel with the first data line DL1 to the sixth data line DL6. The first horizontal connection line DH1 to the third horizontal connection line DH3 may each have a shape extending in the first direction (the x-axis direction) crossing the second direction (the y-axis direction) in which the first data line DL1 to the sixth data line DL6 extend.

The second input line IL2, the fourth input line IL4, and the sixth input line IL6 may be electrically and respectively connected to their corresponding ones of the first additional vertical connection line DV1 to the third additional vertical connection line DV3 through the second contact hole CNT2. The first horizontal connection line DH1, the second horizontal connection line DH2, and the third horizontal connection line DH3 may be electrically connected to their corresponding ones of the first additional vertical connection line DV1, the second additional vertical connection line DV2, and the third additional vertical connection line DV3 through first connection contact holes DH-CNT1 located in ends of the first horizontal connection line DH1, the second horizontal connection line DH2, and the third horizontal connection line DH3. The first connection contact hole DH-CNT1 may be located in the display area DA. The first horizontal connection line DH1, the second horizontal connection line DH2, and the third horizontal connection line DH3 may be electrically connected to their corresponding ones of the first vertical connection line DV1', the second vertical connection line DV2', and the third vertical connection line DV3' through second connection contact holes DH-CNT2 located in the other ends of the first horizontal connection line DH1, the second horizontal connection line DH2, and the third horizontal connection line DH3. The second connection contact hole DH-CNT2 may be located in the display area DA.

The first vertical connection line DV1', the second vertical connection line DV2', and the third vertical connection line DV3' may be electrically connected to their corresponding ones of the second data line DL2, the fourth data line DL4, and the sixth data line DL6, respectively. In detail, the first vertical connection line DV1, the second vertical connection line DV2', and the third vertical connection line DV3' may be electrically connected to their corresponding ones of the second data line DL2, the fourth data line DL4, and the sixth data line DL6, respectively, in the peripheral area PA on the outer side of the display area DA, for example, in the first peripheral area PA1. FIG. 3 shows that the first vertical connection line DV1', the second vertical connection line DV2', and the third vertical connection line DV3' respectively correspond to and are integrally formed with the second data line DL2, the fourth data line DL4, and the sixth data line DL6, and thus, the first vertical connection line DV1', the second vertical connection line DV2', and the third vertical connection line DV3' are respectively connected to the second data line DL2, the fourth data line DL4, and the sixth data line DL6 in the first peripheral area PA1.

The first data line DL1 to the sixth data line DL6, the first vertical connection line DV1' to the third vertical connection line DV3', and the first additional vertical connection line DV1 to the third additional vertical connection line DV3 may be arranged on the same layer. The first horizontal connection line DH1 to the third horizontal connection line DH3 may be located on a different layer from the first data line DL1 to the sixth data line DL6. FIG. 3 shows that the first data line DL1 to the sixth data line DL6, etc. are located on an insulating layer covering the first horizontal connection line DH1 to the third horizontal connection line DH3. For reference, the description that components are on the same layer may indicate that the components are simultaneously formed of the same material through the same mask process. In this case, the components may include the same material.

When viewed in a direction perpendicular to the substrate 100 (in the z-axis direction), the first horizontal connection line DH1 may cross the first data line DL, the second horizontal connection line DH2 may cross the first data line DL1 to the third data line DL3, and the third horizontal connection line DH3 may cross the first data line DL1 to the fifth data line DL5. Therefore, as described above, the first horizontal connection line DH1 to the third horizontal connection line DH3 may be arranged under the first data line DL1 to the sixth data line DL6 not to contact data lines crossing the first horizontal connection line DH1 to the third horizontal connection line DH3.

As shown in FIG. 3, the display apparatus may further include dummy lines.

As shown in FIG. 3, the display apparatus may include a first auxiliary horizontal connection line ADH1 that is apart from the first horizontal connection line DH1, is electrically insulated from the first horizontal connection line DH1 and the second data line DL2, and has the same extension axis as an extension axis of the first horizontal connection line DH1. For example, the display apparatus may include the first auxiliary horizontal connection line ADH1 arranged on one side of the first horizontal connection line DH1 (the −x direction) and the first auxiliary horizontal connection line ADH1 arranged on the other side of the first horizontal connection line DH1 (the +x direction). Likewise, the display apparatus may include a second auxiliary horizontal connection line ADH2 arranged on one side of the second horizontal connection line DH2 (the −x direction) and a second auxiliary horizontal connection line ADH2 arranged on the other side of the second horizontal connection line DH2 (the +x direction), and may include a third auxiliary horizontal connection line ADH3 arranged on one side of the third horizontal connection line DH3 (the −x direction) and a third auxiliary horizontal connection line ADH3 arranged on the other side of the third horizontal connection line DH3 (the +x direction). The first auxiliary horizontal connection line ADH1, the second auxiliary horizontal connection line ADH2, and the third auxiliary horizontal connection line ADH3 are electrically insulated from the first horizontal connection line DH1, the second horizontal connection line DH2, and the third horizontal connection line DH3 and also from the data lines.

To this end, a structural difference between pixels, through which the first horizontal connection line DH1 to the third horizontal connection line DH3 pass, and pixels, through which the first horizontal connection line DH1 to the third horizontal connection line DH3 do not pass, may be reduced. As a result, when the same electrical signal is applied to the pixels, the difference in the brightness of the pixels may be reduced, and thus, a display apparatus capable of displaying a high-quality image may be realized. The first auxiliary horizontal connection line ADH1 to the third auxiliary horizontal connection line ADH3 may be on the same layer as the first horizontal connection line DH1 to the third horizontal connection line DH3.

Similarly, the display apparatus may include a first auxiliary vertical connection line ADV1' that is apart from the first vertical connection line DV1', is electrically insulated from the first vertical connection line DV1' and the first horizontal connection line DH1, has the same extension axis as an extension axis of the first vertical connection line DV1', and thus is arranged on one side of the first vertical connection line DV1' (the +y direction). Likewise, the display apparatus may include a second auxiliary vertical connection line ADV2' that is on one side of the second vertical connection line DV2' (the +y direction) and a third auxiliary vertical connection line ADV3' that is on one side of the third vertical connection line DV3' (+y direction). The first auxiliary vertical connection line ADV1' to the third auxiliary vertical connection line ADV3' may be on the same layer as the first vertical connection line DV1' to the third vertical connection line DV3', The display apparatus may include a first auxiliary additional vertical connection line ADV1 that is apart from the first additional vertical connection line DV1, is electrically insulated from the first additional vertical connection line DV1 and the first horizontal connection line DH1, has the same extension axis as an extension axis of the first additional vertical connection line DV1, and thus is arranged on one side of the first additional vertical connection line DV1 (the +y direction). Likewise, the display apparatus may include a second auxiliary additional vertical connection line ADV2 that is on one side of the second additional vertical connection line DV2 (the +y direction) and a third auxiliary additional vertical connection line ADV3 that is on one side of the third additional vertical connection line DV3 (+y direction). The first auxiliary additional vertical connection line ADV1 to the third auxiliary additional vertical connection line ADV3 may be on the same layer as the first additional vertical connection line DV1 to the third additional vertical connection line DV3.

To this end, the structural difference between the pixels, through which the first vertical connection line DV1' to the third vertical connection line DV3' pass, and the pixels, through which the first vertical connection line DV1' to the third vertical connection line DV3' do not pass, may decrease. The structural difference between the pixels, through which the first additional vertical connection line DV1 to the third additional vertical connection line DV3 pass, and the pixels, through which the first additional vertical connection line DV1 to the third additional vertical connection line DV3 do not pass, may decrease. As a result, when the same electrical signal is applied to the pixels, the difference in the brightness of the pixels may be reduced, and thus, a display apparatus capable of displaying a high-quality image may be realized.

As shown in FIG. 3, a fourth horizontal connection line DH4 may be located in a central direction (the +y direction) of the display area DA with respect to the third horizontal connection line DH3. Similar to the third horizontal connection line DH3, the fourth horizontal connection line DH4 may extend in the first direction (the x-axis direction). The fourth horizontal connection line DH4 may extend from the first peripheral area PA1 on one side of the display area DA (in the −x direction) to the first peripheral area PA1 on the other side of the display area DA (in the +x direction). The fourth horizontal connection line DH4 may not be electrically connected to the data lines. The display apparatus may include a plurality of fourth horizontal connection lines DH4 that are apart from each other. As there are the fourth horizontal connection lines DH4, the structural difference between pixels, through which the third horizontal connection line DH3, etc. pass, and pixels located at the center of the display area DA, etc. may be reduced. Both ends of each of the fourth horizontal connection lines DH4 that are not electrically connected to the data lines may be electrically connected to, for example, the common voltage supply line 16. To this end, the common voltage ELVSS may be evenly transmitted to the opposite electrode in the entire display area DA.

Figure 4:
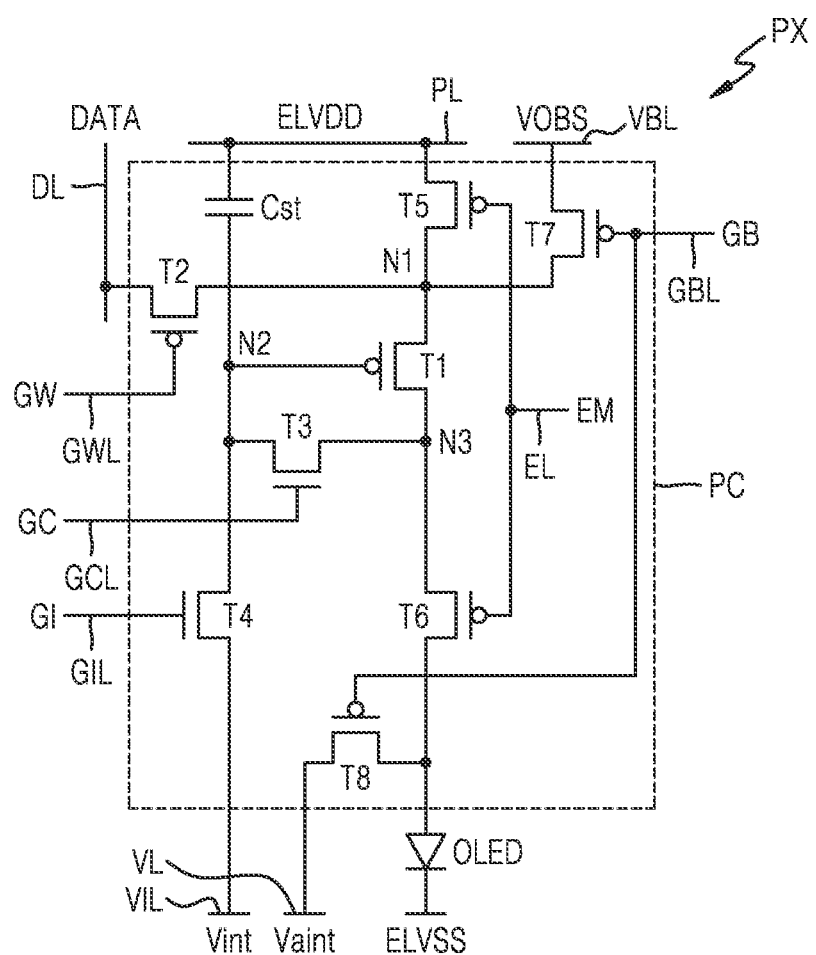
FIG. 4 is an equivalent circuit diagram of a pixel included in the display apparatus of FIG. 1 according to some embodiments.

FIG. 4 is an equivalent circuit diagram of a pixel PX included in the display apparatus of FIG. 1. As shown in FIG. 4, the pixel PX may include a pixel circuit PC and an organic light-emitting diode OLED electrically connected thereto.

As shown in FIG. 4, the pixel circuit PC may include a plurality of thin-film transistors T1 to T8 and a storage capacitor Cst. The thin-film transistors T1 to T8 and the storage capacitor Cst may be connected to signal lines GWL, GCL, GIL, GBL, EL, and DL, a first initialization voltage line VIL, a second initialization voltage line VL, a driving voltage line PL, and a bias voltage line VBL. At least any one of the above lines, e.g., the driving voltage line PL, may be shared by neighboring pixels PX The thin-film transistors T1 to T8 may include a driving transistor T1, a switching transistor T2, a compensation transistor T3, a first initialization transistor T4, an operation control transistor T5, an emission control transistor T6, a bias transistor T7, and a second initialization transistor T8.

The organic light-emitting diode OLED may include a pixel electrode and an opposite electrode, the pixel electrode of the organic light-emitting diode OLED may be connected to the driving transistor T1 through the emission control transistor T6 and receive a driving current, and the opposite electrode of the organic light-emitting diode OLED may receive the common voltage ELVSS. The organic light-emitting diode OLED may generate light having a brightness corresponding to the driving current.

Some of the thin-film transistors T1 to T8 may each be an n-channel MOSFET (NMOS), and the others thereof may each be a p-channel MOSFET (PMOS). For example, the compensation transistor T3 and the first initialization transistor T4 among the thin-film transistors T1 to TB may each be an NMOS, and the others thereof may each be a PMOS. Alternatively, the compensation transistor T3, the first initialization transistor T4, and the second initialization transistor T8 among the thin-film transistors T1 to T8 may each be an NMOS, and the others thereof may each be a PMOS. Alternatively, all of the thin-film transistors T1 to T8 may be NMOSs or PMOSs. The thin-film transistors T1 to T8 may include amorphous silicon or polysilicon. According to necessity, an NMOS may include an oxide semiconductor. Hereinafter, the compensation transistor T3 and the first initialization transistor T4 each are an NMOS including an oxide semiconductor, and the others each are a PMOS.

The signal lines may include a first scan line GWL configured to transmit a first scan signal GW, a second scan line GCL configured to transmit a second scan signal GC, a third scan line GIL configured to transmit an initialization scan signal GI to the first initialization transistor T4, a fourth scan line GBL configured to transmit a bias scan signal GB to the bias transistor T7 and the second initialization transistor T8, an emission control line EL configured to transmit an emission control signal EM to the operation control transistor T5 and the emission control transistor T6, and a data line DL crossing the first scan line GWL and configured to transmit a data signal DATA.

The driving voltage line PL may be configured to transmit the driving voltage ELVDD to the driving transistor T1, the first initialization voltage line VIL may be configured to transmit a first initialization voltage Vint for initializing the driving transistor T1, and the second initialization voltage line VL may be configured to transmit a second initialization voltage Vaint for initializing the pixel electrode of the organic light-emitting diode OLED.

A driving gate electrode of the driving transistor T1 may be connected to the storage capacitor Cst through a second node N2, any one of a source area and a drain area of the driving transistor T1 may be connected to the driving voltage line PL through a first node N1 via the operation control transistor T5, and the other of the source area and the drain area of the driving transistor T1 may be electrically connected to the pixel electrode of the organic light-emitting diode OLED through a third node N3 via the emission control transistor T6. The driving transistor T1 may receive the data signal DATA according to a switching operation of the switching transistor T2 and may be configured to supply a driving current to the organic light-emitting diode OLED. That is, the driving transistor T1 may control the amount of current flowing to the organic light-emitting diode OLED from the first node N1 electrically connected to the driving voltage line PL, according to a voltage differing according to the data signal DATA and applied to the second node N2.

A switching gate electrode of the switching transistor T2 may be connected to the first scan line GWL configured to transmit the first scan signal GW, any one of a source area and a drain area of the switching transistor T2 may be connected to the data line DL, and the other thereof may be connected to the driving transistor T1 through the first node N1 and also to the driving voltage line PL via the operation control transistor T5. The switching transistor T2 may be configured to transmit, to the first node N1, the data signal DATA transmitted through the data line DL, according to a voltage applied to the first scan line GWL. That is, the switching transistor T2 may be turned on in response to the first scan signal GW transmitted through the first scan line GWL and perform a switching operation of transmitting the data signal DATA, which is transmitted through the data line DL, to the driving transistor T1 through the first node N1.

A compensation gate electrode of the compensation transistor T3 is connected to the second scan line GCL. Any one of a source area and a drain area of the compensation transistor T3 may be connected to the pixel electrode of the organic light-emitting diode OLED through the third node N3 via the emission control transistor T6 and may be connected to the driving transistor T1 through the third node N3. The other of the source area and the drain area of the compensation transistor T3 may be connected to a first capacitor electrode of the storage capacitor Cst and the driving gate electrode of the driving transistor T1 through the second node N2. The compensation transistor T3 may be turned on in response to the second scan signal GC transmitted through the second scan line GCL and may diode-connect the driving transistor T1.

A first initialization gate electrode of the first initialization transistor T4 may be connected to the third scan line GIL. Any one of a source area and a drain area of the first initialization transistor T4 may be connected to the first initialization voltage line VIL. The other of the source area and the drain area of the first initialization transistor T4 may be connected to the first capacitor electrode of the storage capacitor Cst, the driving gate electrode of the driving transistor T1, and the like through the second node N2. The first initialization transistor T4 may apply the first initialization voltage Vint, which is transmitted through the first initialization voltage line VIL, to the second node N2, according to a voltage applied to the third scan line GIL. That is, the first initialization transistor T4 may be turned on in response to the initialization scan signal GI transmitted through the third scan line GIL and may be configured to transmit the first initialization voltage Vint to the driving gate electrode of the driving transistor T1, thereby performing an initialization operation of initializing a voltage of the driving gate electrode of the driving transistor T1.

An operation control gate electrode of the operation control transistor T5 may be connected to the emission control line EL, any one of a source area and a drain area of the operation control transistor T5 may be connected to the driving voltage line PL, and the other thereof may be connected to the driving transistor T1 and the switching transistor T2 through the first node N1.

An emission control gate electrode of the emission control transistor T6 may be connected to the emission control line EL, any one of a source area and a drain area of the emission control transistor T6 may be connected to the driving transistor T1 and the compensation transistor T3 through the third node N3, and the other thereof may be electrically connected to the pixel electrode of the organic light-emitting diode OLED.

The operation control transistor T5 and the emission control transistor T6 may be simultaneously turned on in response to the emission control signal EM transmitted through the emission control line EL and configured to transmit electrical signals from the driving voltage ELVDD to the organic light-emitting diode OLED so that the driving current flows in the organic light-emitting diode OLED.

The bias transistor T7 may be connected between the first node N1 and the bias voltage line VBL. The bias transistor T7 may be turned on in response to the bias scan signal GB transmitted through the fourth scan line GBL and apply a bias voltage VOBS to the first node N1 to thus preset, in the first node N1, a voltage appropriate for a subsequent operation of the driving transistor T1. In this regard, the fourth scan line GBL may be referred to as a bias gate line.

A second initialization gate electrode of the second initialization transistor T8 may be connected to the fourth scan line GBL, any one of a source area and a drain area of the second initialization transistor T8 may be connected to the pixel electrode of the organic light-emitting diode OLED, and the other thereof may be connected to the second initialization voltage line VL and receive the second initialization voltage Vaint. The second initialization transistor T8 is turned on in response to the bias scan signal GB transmitted through the fourth scan line GBL and initializes the pixel electrode of the organic light-emitting diode OLED, The storage capacitor Cst may include the first capacitor electrode and a second capacitor electrode. The first capacitor electrode of the storage capacitor Cst is connected to the driving gate electrode of the driving transistor T1 through the second node N2, and the second capacitor electrode of the storage capacitor Cst is connected to the driving voltage line PL. The storage capacitor Cst may store therein electric charges corresponding to a difference between the voltage of the driving gate electrode of the driving transistor T1 and the driving voltage ELVDD.

A detailed operation of each pixel PX according to some embodiments is described as follows.

During an initialization period, when the initialization scan signal GI is provided through the third scan line GIL, the first initialization transistor T4 is turned on in response to the initialization scan signal GI, and the driving transistor T1 is initialized according to the first initialization voltage Vint provided through the first initialization voltage line VIL. When the bias scan signal GB is provided through the fourth scan line GBL, the second initialization transistor T8 is turned on in response to the bias scan signal GB, and the pixel electrode of the organic light-emitting diode OLED is initialized according to the second initialization voltage Vaint provided through the second initialization voltage line VL. Also, the bias transistor T7 is also turned on in response to the bias scan signal GB and configured to apply the bias voltage VOBS to the first node N1, and thus, a voltage appropriate for a subsequent operation of the driving transistor T1 may be preset in the first node N1.

During a data programming period, when the first scan signal GW and the second scan signal GC are respectively provided through the first scan line GWL and the second scan line GCL, the switching transistor T2 and the compensation transistor T3 are respectively turned on in response to the first scan signal GW and the second scan signal GC. In this case, the driving transistor T1 is diode-connected by the compensation transistor T3 that is on, and biased in a forward direction. Then, a compensation voltage DATA+ Vth (where Vth has a negative value), which is generated by subtracting a threshold voltage Vth of the driving transistor T1 from the data signal DATA provided through the data line DL, is applied to the driving gate electrode of the driving transistor T1. The driving voltage ELVDD and the compensation voltage DATA+Vth are applied to both ends of the storage capacitor Cst, and electric charges corresponding to a voltage difference in the ends of the storage capacitor Cst are stored in the storage capacitor Cst.

During an emission period, the operation control transistor T5 and the emission control transistor T6 are turned on in response to the emission control signal EM transmitted through the emission control line EL. A driving current according to a difference between the voltage of the driving gate electrode of the driving transistor T1 and the driving voltage ELVDD is generated, and the driving current is supplied to the organic light-emitting diode OLED through the emission control transistor T6.

As described above, some of the thin-film transistors T1 to T8 may include oxide semiconductors. For example, the compensation transistor T3 and the first initialization transistor T4 may include oxide semiconductors.

Because polysilicon is highly reliable, an accurately intended current may be allowed to flow. Therefore, the driving transistor T1 directly affecting the brightness of the display apparatus includes a semiconductor layer including polysilicon with high reliability, and thus, a high-resolution display apparatus may be realized. Because an oxide semiconductor has high carrier mobility and a low leakage current, a voltage drop is not great despite a long operation time. That is, in the case of the oxide semiconductor, because a color change in images according to the voltage drop is not noticeable even during a low-frequency operation, the display apparatus may operate at a low frequency. Therefore, the compensation transistor T3 and the first initialization transistor T4 each are designed to include an oxide semiconductor, and thus, a display apparatus in which the occurrence of a leakage current may be prevented or reduced and the power consumption is reduced may be realized.

Such an oxide semiconductor is sensitive to light, and thus, some changes may be made to the amount of current, etc. because of external light. Therefore, a metal layer is arranged under the oxide semiconductor to absorb or reflect the external light. As shown in FIG. 4, in each of the compensation transistor T3 and the first initialization transistor T4 including the oxide semiconductors, gate electrodes may be respectively arranged over and under an oxide semiconductor layer. That is, when viewed in a direction perpendicular to an upper surface of the substrate 100 (in a z-axis direction), the metal layer arranged under the oxide semiconductor may overlap the oxide semiconductor.

Figure 5:
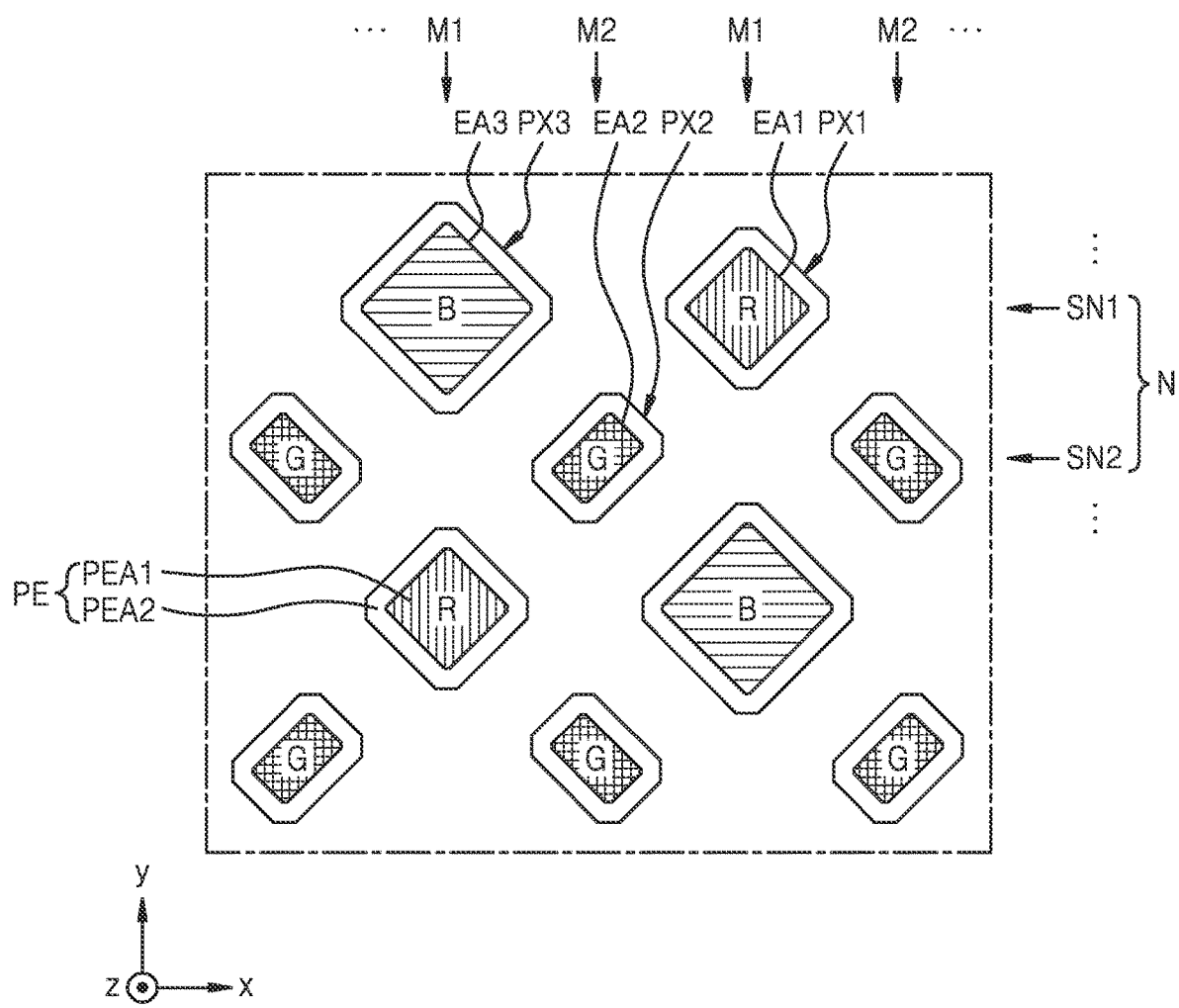
FIG. 5 is a schematic layout of emission areas of pixels included in the display apparatus of FIG. 1 according to some embodiments.

FIG. 5 is a schematic layout of emission areas of pixels included in the display apparatus of FIG. 1.

The pixels arranged in the display area DA may include a first pixel PX1, a second pixel PX2, and a third pixel PX3. The first pixel PX1, the second pixel PX2, and the third pixel PX3 may be repeatedly arranged along a certain pattern in an x-axis direction and a y-axis direction. The first pixel PX1, the second pixel PX2, and the third pixel PX3 may each include a pixel circuit and an organic light-emitting diode OLED electrically connected thereto. The organic light-emitting diode OLED of each pixel may be located on an upper layer of the pixel circuit. The organic light-emitting diode OLED may be located directly on the pixel circuit to overlap the same or may be offset from the pixel circuit and arranged to partially overlap a pixel circuit of another pixel in an adjacent pixel and/or column.

FIG. 5 shows a pixel electrode PE and an emission area of each of the first pixel PX1, the second pixel PX2, and the third pixel PX3. The emission area is an area where an emission layer of the organic light-emitting diode OLED is arranged. The emission area may be defined by a pixel-defining layer including an opening corresponding to a central portion of the pixel electrode PE. Each pixel electrode PE may include a first area PEA1 corresponding to the emission area and a second area PEA2 surrounding the first area PEA1. The first area PEA1 may correspond to the opening of the pixel-defining layer, and the second area PEA2 may be a portion covered by the pixel-defining layer.

In a first column M1, a first emission area EA1 of the first pixel PX1 and a third emission area EA3 of the third pixel PX3 may be alternately arranged in the y-axis direction. In a second column M2, a second emission area EA2 of the second pixel PX2 may be repeatedly arranged in the y-axis direction. The first column M1 and the second column M2 may be alternately arranged in the x-axis direction, and the first emission areas EA1 of the first pixels PX1 may be arranged opposite to the third emission areas EA3 of the third pixels PX3 in adjacent first columns M1.

In a first sub-row SN1 of each row N, the first emission area EA1 of the first pixel PX1 and the third emission area EA3 of the third pixel PX3 may be alternately arranged in the x-axis direction, and in a second sub-row SN2, the second emission areas EA2 of the second pixels PX2 may be repeatedly arranged in the x-axis direction. That is, in each row N, the first emission area EA1 of the first pixel PX1, the second emission area EA2 of the second pixel PX2, the third emission area EA3 of the third pixel PX3, and the second emission area EA2 of the second pixel PX2 may be repeatedly arranged in a zigzag form.

The first emission area EA1 of the first pixel PX1, the second emission area EA2 of the second pixel PX2, and the third emission area EA3 of the third pixel PX3 may have different areas. For example, the third emission area EA3 of the third pixel PX3 may have a greater area than the first emission area EA1 of the first pixel PX1. Also, the third emission area EA3 of the third pixel PX3 may have a greater area than the second emission area EA2 of the second pixel PX2. The first emission area EA1 of the first pixel PX1 may have a greater area than the second emission area EA2 of the second pixel PX2. In some embodiments, the third emission area EA3 of the third pixel PX3 may have the same area as the first emission area EA1 of the first pixel PX1. However, one or more embodiments are not limited thereto. Various modifications may be made, and for example, the first emission area EA1 of the first pixel PX1 may have a greater area than the second emission area EA2 of the second pixel PX2 and the third emission area EA3 of the third pixel PX3.

Each of the first emission area EA1, the second emission area EA2, and the third emission area EA3 may have a polygonal shape such as a rectangular shape or an octagonal shape, a circular shape, or an oval shape. In the case of the polygonal shape, corners (vertices) of the first emission area EA1, the second emission area EA2, and the third emission area EA3 may be rounded.

The first pixel PX1 may be a red pixel R emitting red light, the second pixel PX2 may be a green pixel G emitting green light, and the third pixel PX3 may be a blue pixel B emitting blue light.

Figure 6:
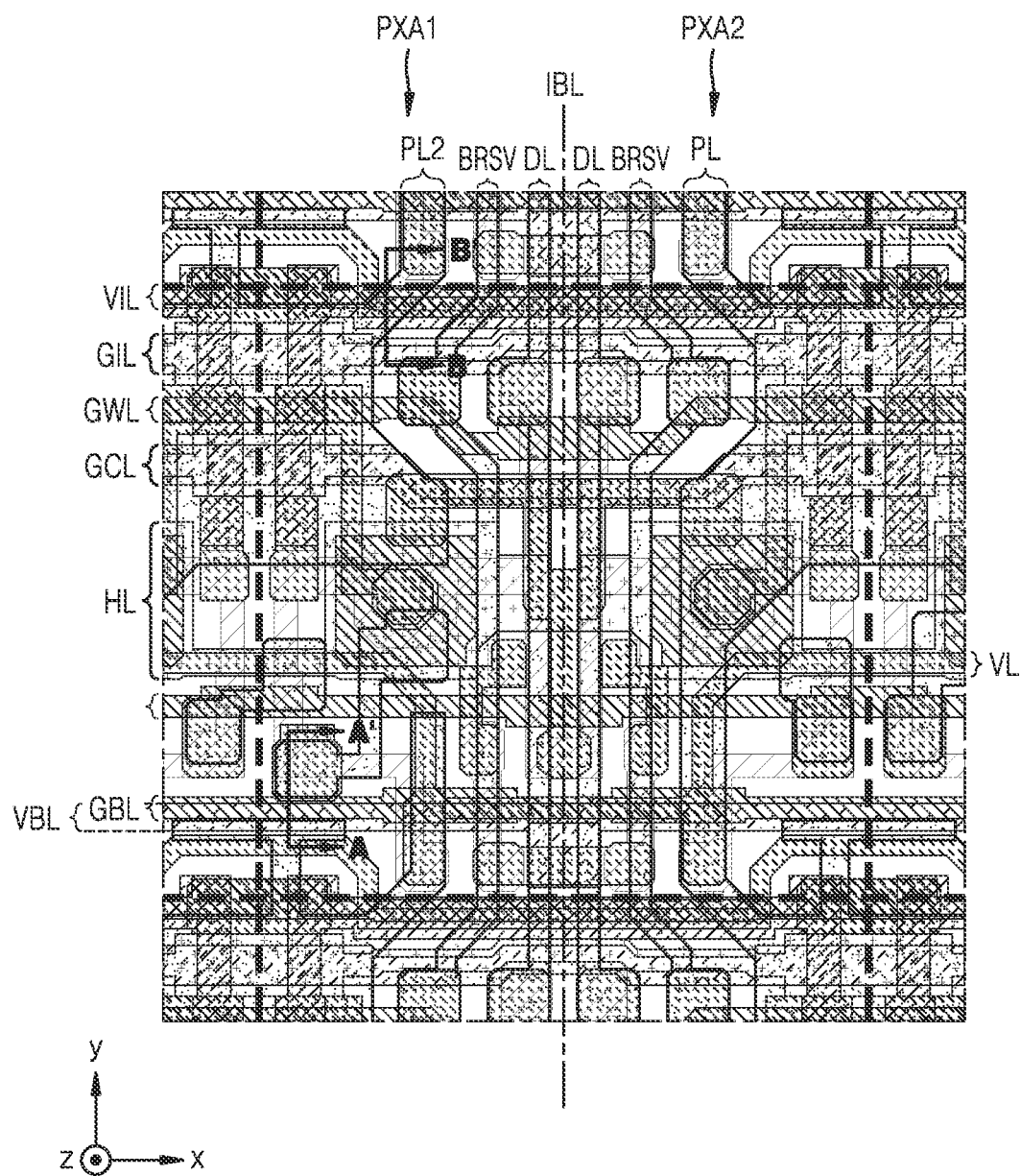
FIG. 6 is a schematic layout showing locations of transistors, storage capacitors, and other components in pixels of the display apparatus of FIG. 1 according to some embodiments.
Figure 12:
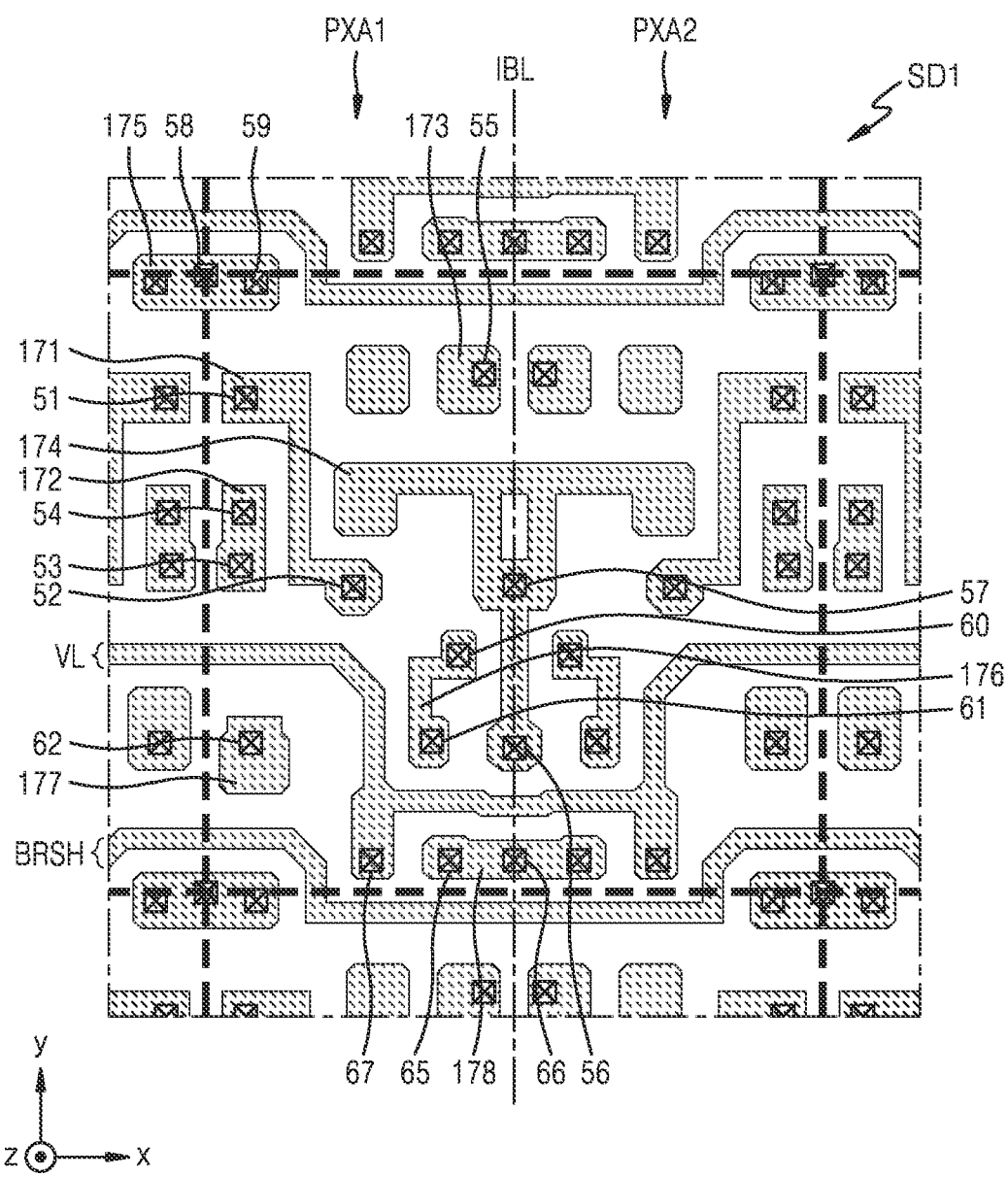
Figure 13:
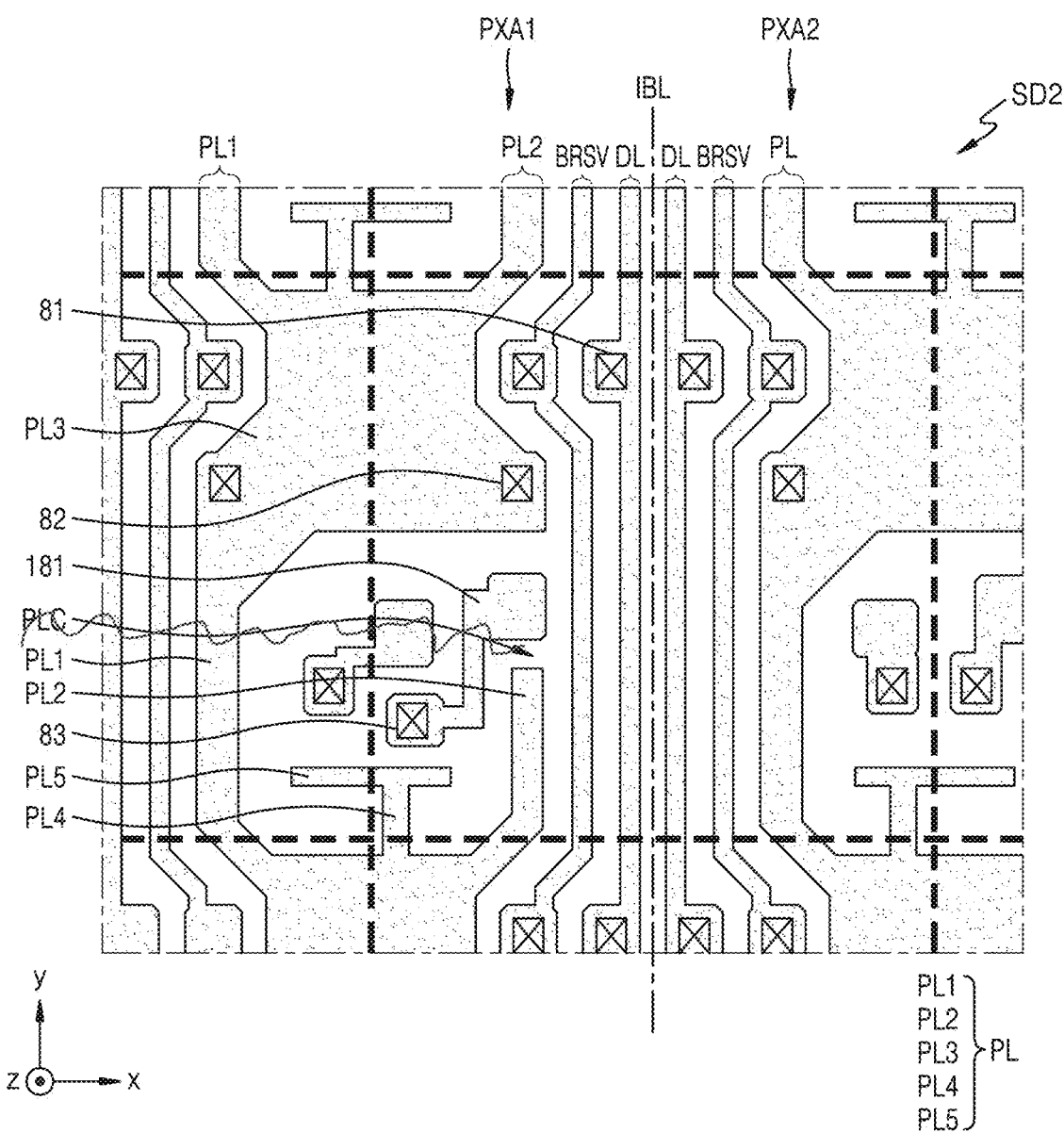
Figure 14:
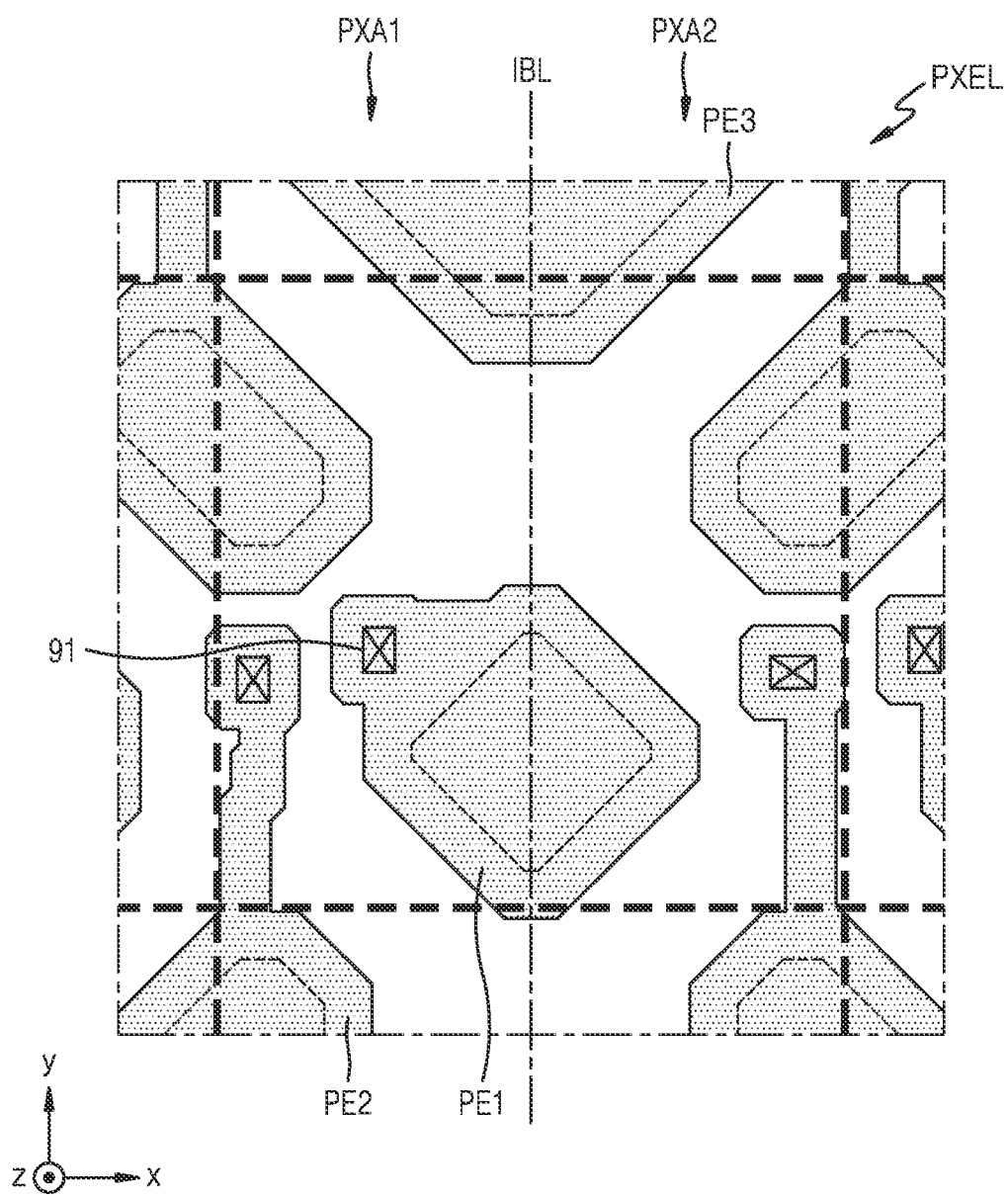
FIG. 14 is a schematic layout of a pixel electrode layer of the display apparatus of FIG. 6 according to some embodiments.
Figure 15:
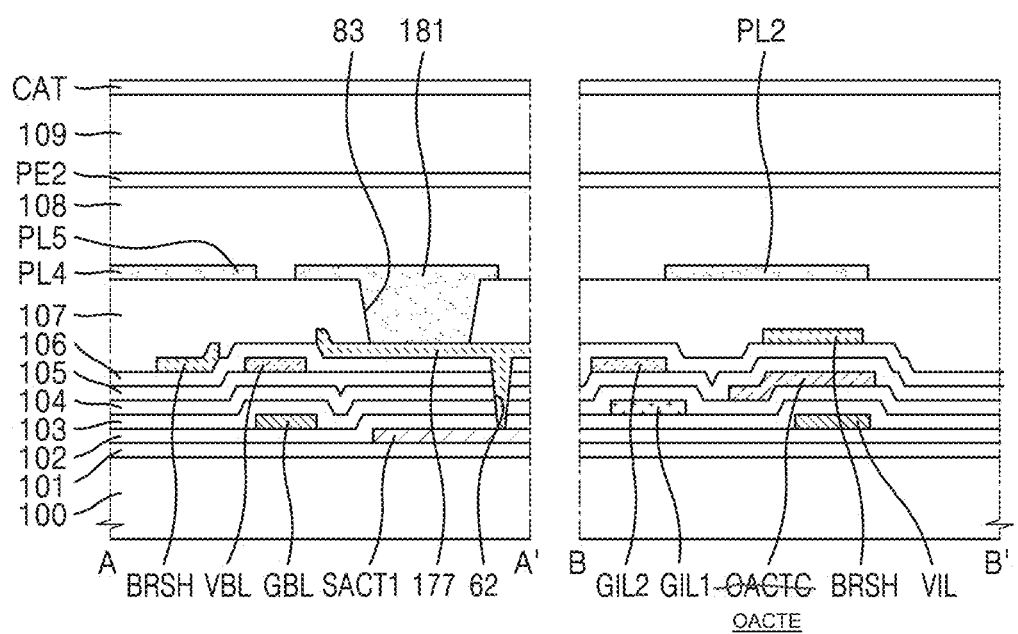
FIG. 15 is a schematic cross-sectional view of the display apparatus of FIG. 6 taken along a line A-A' and a line B-B' of FIG. 6 according to some embodiments.

FIG. 6 is a schematic layout showing locations of transistors, capacitors, and other components in pixels of the display apparatus of FIG. 1, FIGS. 7 to 13 are schematic layouts showing, for each level, components, e.g., transistors and capacitors, which are included in the display apparatus of FIG. 6, FIG. 14 is a schematic layout of a pixel electrode layer of the display apparatus of FIG. 6, and FIG. 15 is a schematic cross-sectional view of the display apparatus of FIG. 6 taken along a line A-A' and a line B-B' of FIG. 6.

As shown in the above drawings, the display apparatus may include a first pixel area PXA1 and a second pixel area PXA2 that are adjacent to each other. A pixel circuit of the first pixel PX1 may be arranged in the first pixel area PXA1, and a pixel circuit of the second pixel PX2 may be arranged in the second pixel area PXA2. The first pixel area PXA1 may be substantially symmetrical to the second pixel area PXA2 with respect to a virtual boundary line IBL, as shown in FIG. 6, etc. Alternatively, the first pixel area PXA1 may have the same configuration as the second pixel area PXA2, instead of a symmetrical configuration. Hereinafter, for convenience, some conductive patterns are described based on the pixel circuit in the first pixel area PXA1, but such conductive patterns may be symmetrically or identically arranged in the second pixel area PXA2.

For reference, the configuration shown in FIGS. 6 to 13 may be repeated in the first direction (the x-axis direction) as well as the second direction (the y-axis direction).

On the substrate 100, a buffer layer (101, see FIG. 15) including silicon oxide, silicon nitride, or silicon oxynitride may be located. The buffer layer 101 may prevent or reduce instances of metal atoms, impurities, or the like diffusing from the substrate 100 towards a first semiconductor layer SACT located on the buffer layer 101. Also, the buffer layer 101 may adjust the heat irradiation speed during a crystallization process of forming the first semiconductor layer SACT, and thus, the first semiconductor layer SACT may be evenly crystallized.

Figure 7:
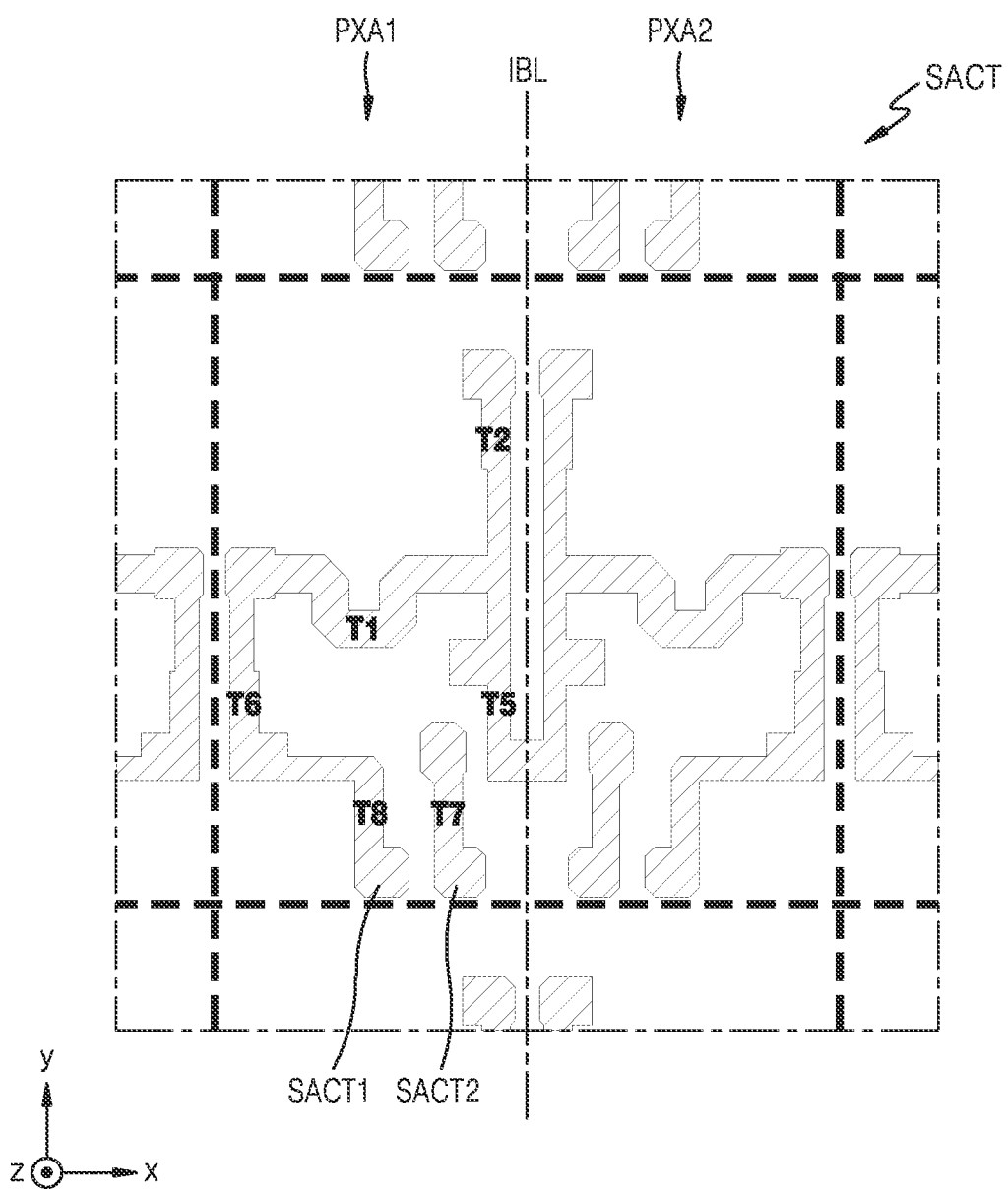
FIGS. 7 to 13 are schematic layouts showing, for each level, components, e.g., transistors and storage capacitors, which are included in the display apparatus of FIG. 6 according to some embodiments.

The first semiconductor layer SACT shown in FIG. 7 may be located on the buffer layer 101. The first semiconductor layer SACT may include a silicon semiconductor. For example, the first semiconductor layer SACT may include amorphous silicon or polysilicon. In detail, the first semiconductor layer SACT may include polysilicon crystallized at a low temperature. According to necessity, ions may be injected into at least a portion of the first semiconductor layer SACT.

The first semiconductor layer SACT may include a first sub-semiconductor layer SACT1 and a second sub-semiconductor layer SACT2 separated from the first sub-semiconductor layer SACT1. The first sub-semiconductor layer SACT1 in the first pixel area PXA1 may be integrally formed with the first sub-semiconductor layer SACT1 in the second pixel area PXA2. As described below, the second sub-semiconductor layer SACT2 may be electrically connected to the first sub-semiconductor layer SACT1 by a connection electrode 176 included in a first connection electrode layer SD1.

The first sub-semiconductor layer SACT1 may have a shape curved in various forms. The driving transistor T1, the switching transistor T2, the operation control transistor T5, the emission control transistor T6, and the second initialization transistor T8 may be arranged along the first sub-semiconductor layer SACT1. That is, the first sub-semiconductor layer SACT1 may include a channel area of each of the driving transistor T1, the switching transistor T2, the operation control transistor T5, the emission control transistor T6, and the second initialization transistor T8, and a source area and a drain area arranged on both sides of the channel area. The second sub-semiconductor layer SACT2 may include a channel area, a source area, and a drain area of the bias transistor T7. In FIG. 7, locations of the channel areas of the above transistors T1, T2, and T5 to T8 are indicated by reference symbols of the transistors T1, T2, and T5 to T8. The source area and the drain area are located on one side and the other side of the channel area.

A first gate insulating layer (102, see FIG. 15) may cover the first semiconductor layer SACT and may be arranged above the substrate 100. The first gate insulating layer 102 may include an insulating material. For example, the first gate insulating layer 102 may include silicon oxide, silicon nitride, silicon oxynitride, aluminum oxide, or the like.

Figure 8:
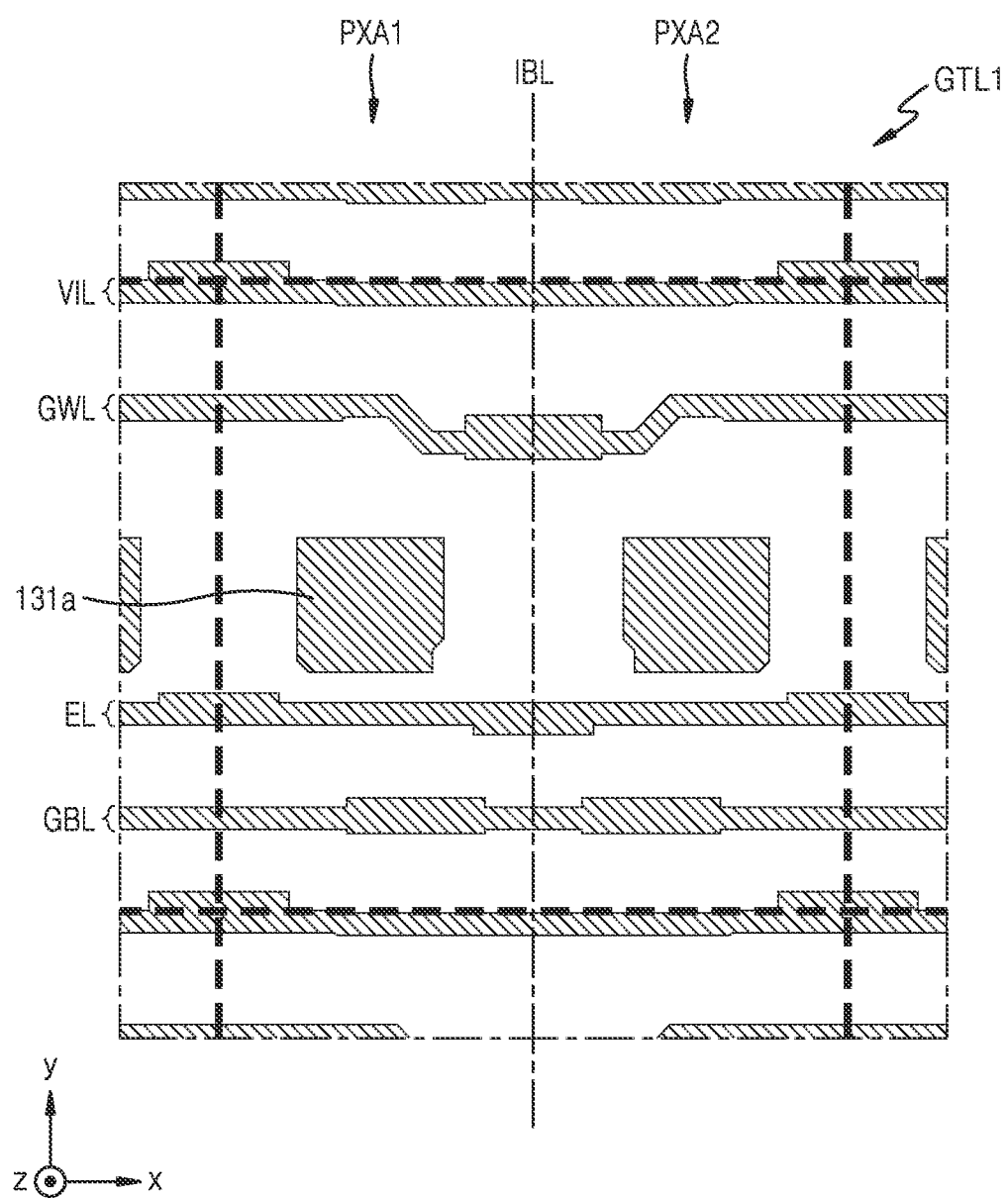

A first gate layer GTL1 shown in FIG. 8 may be located on the first gate insulating layer 102. The first gate layer GTL1 includes the first scan line GWL configured to transmit the first scan signal GW, the fourth scan line GBL configured to transmit the bias scan signal GB to the bias transistor T7 and the second initialization transistor T8, the emission control line EL configured to transmit the emission control signal EM to the operation control transistor T5 and the emission control transistor T6, the first initialization voltage line VIL configured to transmit the first initialization voltage Vint for initializing the driving transistor T1, and a driving gate electrode 131a of the driving transistor T1 having an isolated shape. The driving gate electrode 131a may function as a lower electrode that is a first electrode of the storage capacitor Cst.

The first scan line GWL, the fourth scan line GEL, the emission control line EL, and the first initialization voltage line VIL may each have a shape substantially extending in the first direction (the x-axis direction). Portions of the first scan line GWL, the fourth scan line GEL, and the emission control line EL, which overlap the first semiconductor layer SACT, may respectively function as gate electrodes of transistors. That is, the portion of the first scan line OWL, which overlaps the first semiconductor layer SACT, may be the switching gate electrode of the switching transistor T2, the portions of the fourth scan line GBL, each of which overlaps the first semiconductor layer SACT, may be a bias gate electrode of the bias transistor T7 and the second initialization gate electrode of the second initialization transistor T8, the portions of the emission control line EL, which overlaps the first semiconductor layer SACT, may be the operation control gate electrode of the operation control transistor T5 and the emission control gate electrode of the emission control transistor T6.

The first gate layer GTL1 may include a metal, an alloy, conductive metal oxide, a transparent conductive material, or the like. For example, the first gate layer GTL1 may include silver (Ag), an alloy containing Ag, molybdenum (Mo), an alloy containing Mo, aluminum (Al), an alloy containing Al, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. The first gate layer GTL1 may have a multilayered structure, for example, a two-layer structure of Mo/Al or a three-layer structure of Mo/Al/Mo.

A second gate insulating layer (103, see FIG. 15) may cover the first gate layer GTL1 and may be located on the first gate insulating layer 102. The second gate insulating layer 103 may include the same insulating material as or a similar insulating material to the first gate insulating layer 102.

Figure 9:
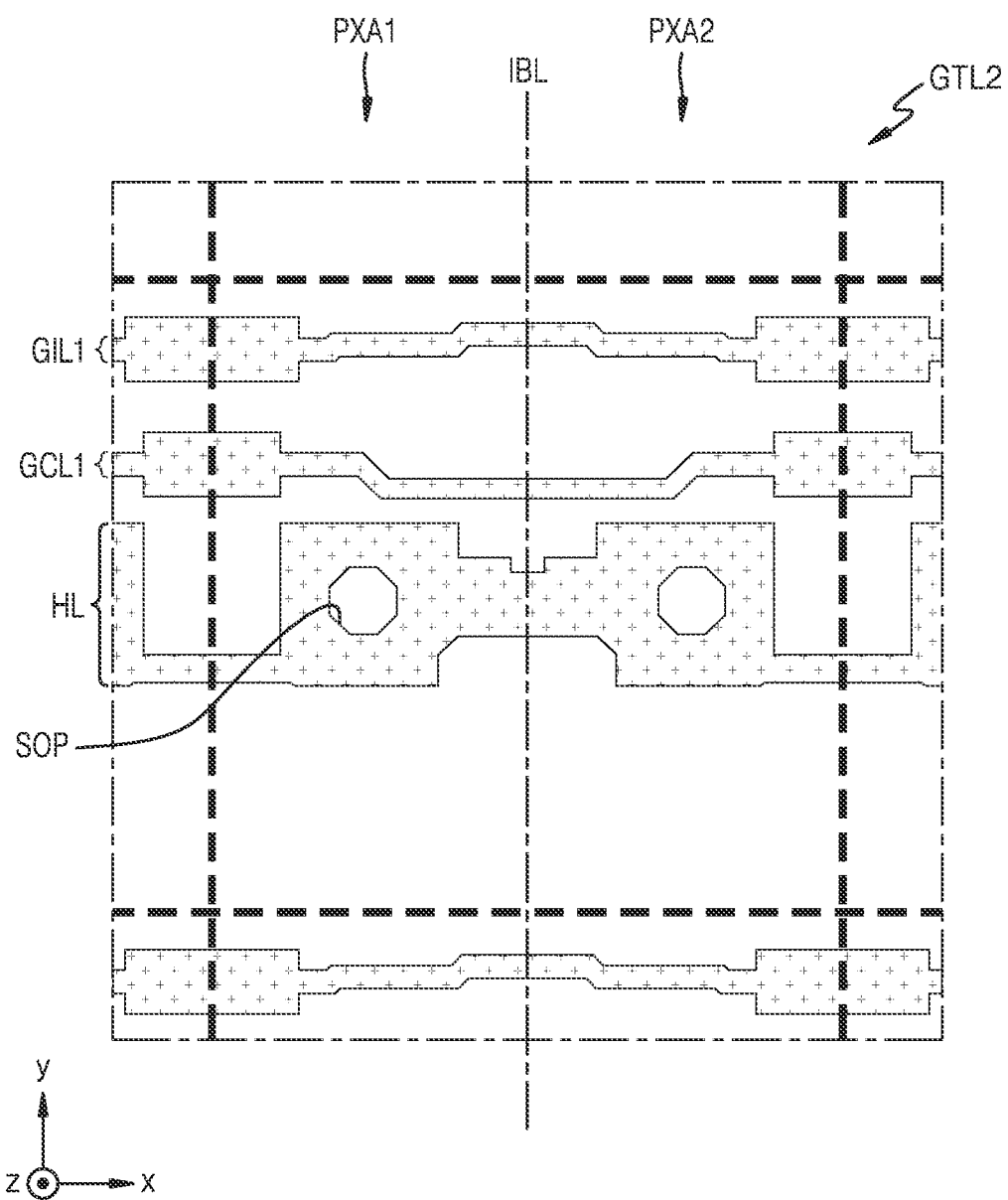

A second gate layer GTL2 shown in FIG. 9 may be located on the second gate insulating layer 103. The second gate layer GTL2 may include an electrode voltage line HL, a lower gate line GCL1 of the second scan line GCL, and a lower gate line GIL1 of the third scan line GIL. The electrode voltage line HL, the lower gate line GCL1 of the second scan line GCL, and the lower gate line GIL1 of the third scan line GIL may extend in the first direction (the x-axis direction).

A portion of the electrode voltage line HL may be an upper electrode that is a second electrode of the storage capacitor Cst and overlap the driving gate electrode 131a that is the lower electrode of the storage capacitor Cst. Upper electrodes of storage capacitors Cst of pixel circuits in the same row may be integrally formed with each other by the electrode voltage line HL. The driving voltage ELVDD may be applied to the upper electrode of the storage capacitor Cst. An opening SOP may be formed in the upper electrode of the storage capacitor Cst, and at least a portion of the driving gate electrode 131a may overlap the opening SOP.

A portion of the lower gate line GCL1 of the second scan line GCL, which overlaps a second semiconductor layer OACT which is an oxide semiconductor layer described below, may be a compensation lower gate electrode of the compensation transistor T3, and a portion of the lower gate line GIL1 of the third scan line GIL, which overlaps the second semiconductor layer OACT, may be a first initialization lower gate electrode of the first initialization transistor T4.

The second gate layer GTL2 may include a metal, an alloy, conductive metal oxide, a transparent conductive material, or the like. For example, the second gate layer GTL2 may include Ag, an alloy containing Ag, Mo, an alloy containing Mo, Al, an alloy containing Al, AlN, W, WN, Cu, Ni, Cr, CrN, Ti, Ta, Pt, Sc, ITO, IZO, or the like. The second gate layer GTL2 may have a multilayered structure, for example, a two-layer structure of Mo/Al or a three-layer structure of Mo/Al/Mo.

A first interlayer insulating layer (104, see FIG. 15) may cover the second gate layer GTL2 and may be located on the second gate insulating layer 103. The first interlayer insulating layer 104 may include an insulating material. For example, the first interlayer insulating layer 104 may include silicon oxide, silicon nitride, silicon oxynitride, aluminum oxide, or the like.

Figure 10:
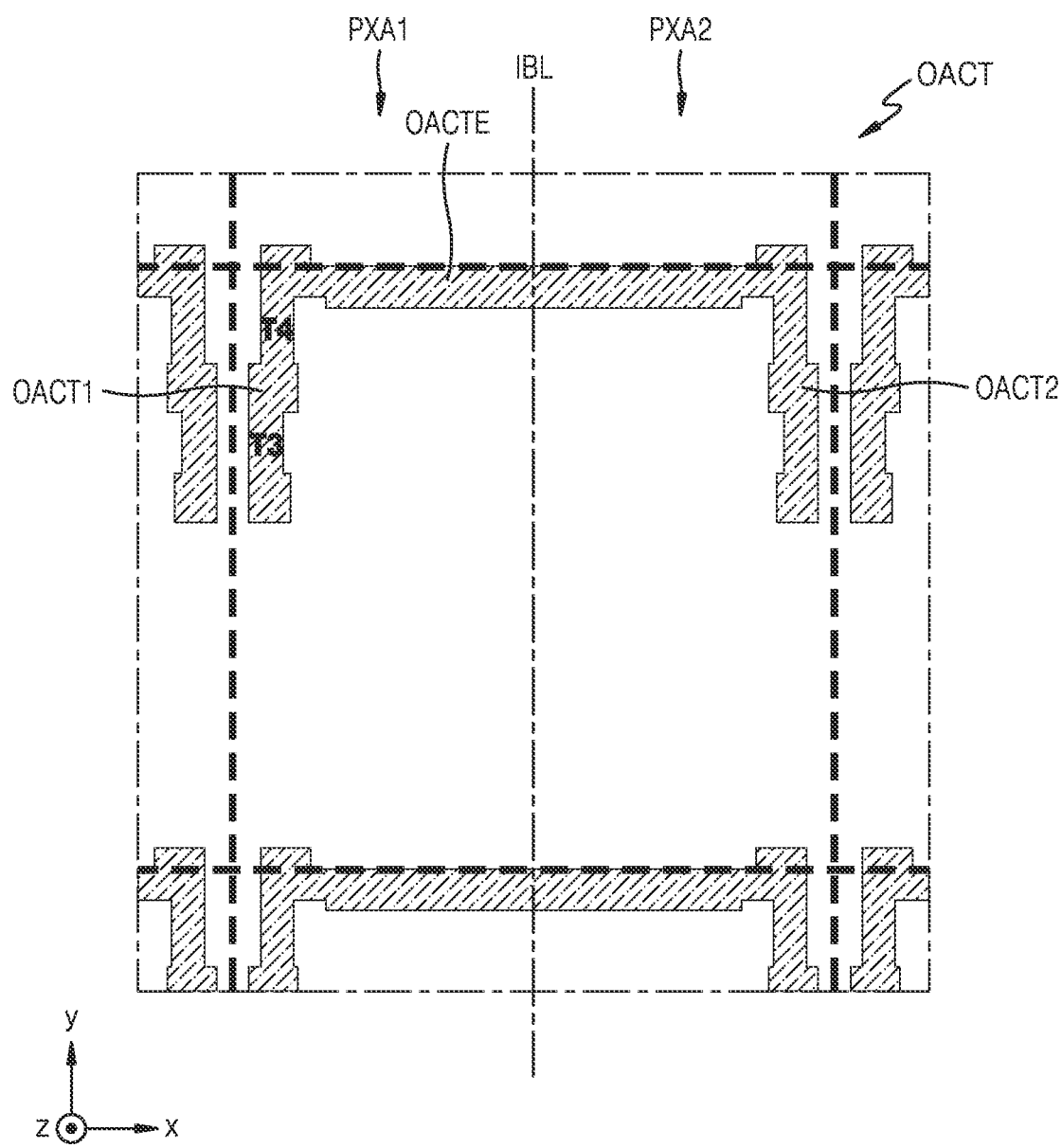

The second semiconductor layer OACT shown in FIG. 10 may be located on the first interlayer insulating layer 104. As described above, the second semiconductor layer OACT may include an oxide semiconductor. The second semiconductor layer OACT may be located on a different layer from the first semiconductor layer SACT and may not overlap the same when viewed in the direction perpendicular to the substrate 100 (in the z-axis direction). The second semiconductor layer OACT may form the compensation transistor T3 and the first initialization transistor T4. In FIG. 10, locations of the channel areas of the compensation transistor T3 and the first initialization transistor T4 are indicated by the reference symbols thereof. The source area and the drain area are located on one side and the other side of the channel area.

The second semiconductor layer OACT may include a $2^{nd}$-$1^{st}$ semiconductor layer CACT1 located in the first pixel area PXA1 and extending in the second direction (the y-axis direction) and a semiconductor extension layer OACTE extending from the $2^{nd}$-$1^{st}$ semiconductor layer OACT1 in the first direction (the x-axis direction). Because a $2^{nd}$-$2^{nd}$ semiconductor layer OACT2 extending in the second direction (the y-axis direction) may be located in the second pixel area PXA2, an end of the semiconductor extension layer OACTE may be connected to the $2^{nd}$-$1^{st}$ semiconductor layer CACT1, and the other end thereof may be connected to the $2^{nd}$-$2^{nd}$ semiconductor layer OACT2. That is, the $2^{nd}$-$1^{st}$ semiconductor layer CACT1 in the first pixel area PXA1, the $2^{nd}$-$2^{nd}$ semiconductor layer OACT2 in the second pixel area PXA2, and the semiconductor extension layer OACTE may be integrally formed.

A third gate insulating layer (105, see FIG. 15) may cover the second semiconductor layer OACT and may be located on the first interlayer insulating layer 104. The third gate insulating layer 105 may include an insulating material. The third gate insulating layer 105 may include silicon oxide, silicon nitride, silicon oxynitride, aluminum oxide, or the like.

Figure 11:
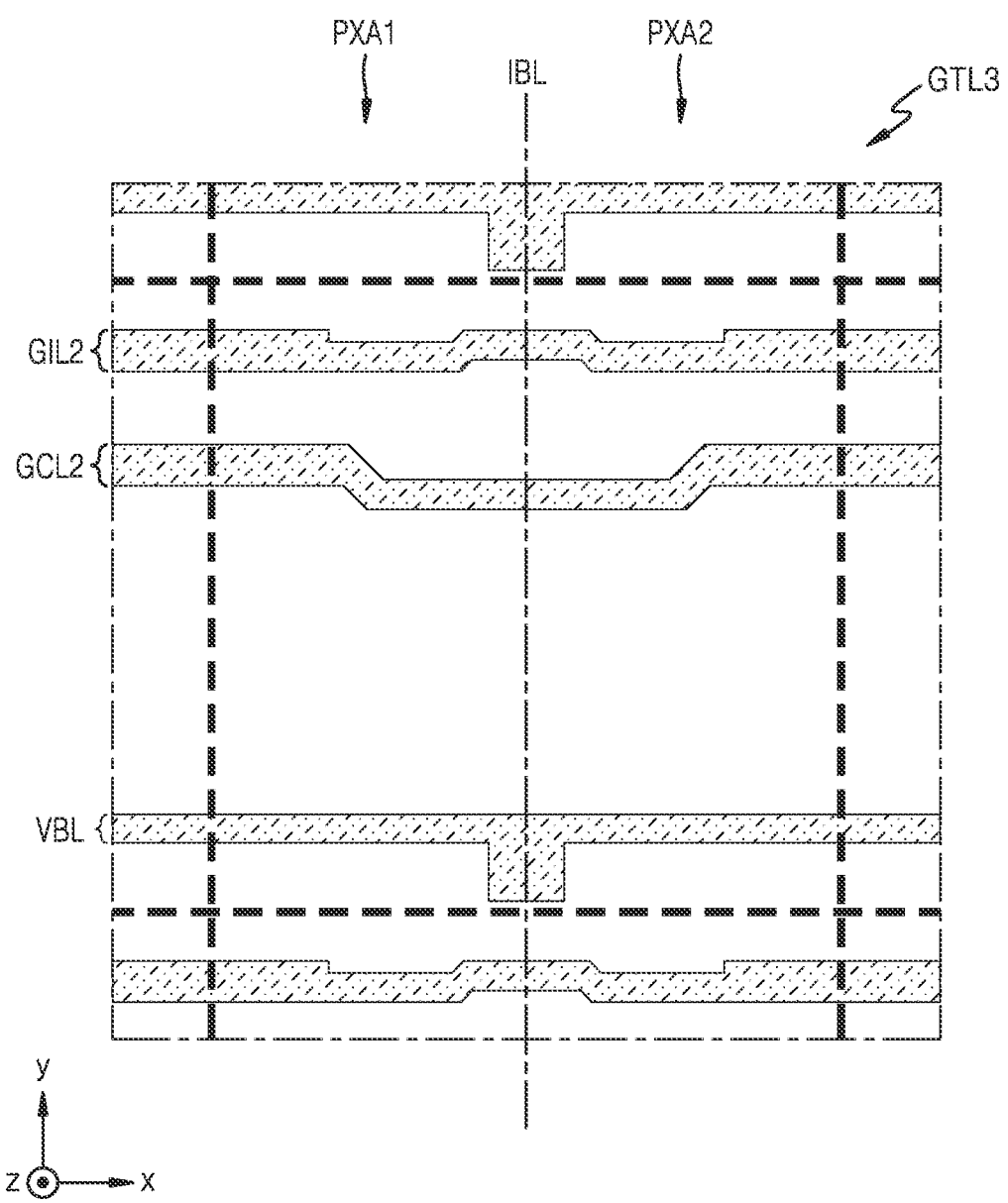

A third gate layer GTL3 shown in FIG. 11 may be located on the third gate insulating layer 105. The third gate layer GTL3 may include an upper gate line GCL2 of the second scan line GCL, an upper gate line GIL2 of the third scan line GIL, and the bias voltage line VBL. The upper gate line GCL2 of the second scan line GCL, the upper gate line GIL2 of the third scan line GIL, and the bias voltage line VBL may extend in the first direction (the x-axis direction), respectively.

A portion of the upper gate line GCL2 of the second scan line GCL, which overlaps the second semiconductor layer OACT, may be a compensation upper gate electrode of the compensation transistor T3, and a portion of the upper gate line GIL2 of the third scan line GIL, which overlaps the second semiconductor layer OACT, may be a first initialization upper gate electrode of the first initialization transistor T4. That is, the compensation transistor T3 and the first initialization transistor T4 may each have a double gate structure in which gate electrodes are located on and under the second semiconductor layer OACT.

The third gate layer GTL3 may include a metal, an alloy, conductive metal oxide, a transparent conductive material, or the like. For example, the third gate layer GTL3 may include Ag, an alloy containing Ag, Mo, an alloy containing Mo, Al, an alloy containing Al, AlN, W, WN, Cu, Ni, Cr, CrN, Ti, Ta, Pt, Sc, ITO, IZO, or the like. The third gate layer GTL3 may have a multilayered structure, for example, a two-layer structure of Mo/Al or a three-layer structure of Mo/Al/Mo.

A second interlayer insulating layer (106, see FIG. 15) may cover at least a portion of the third gate layer GTL3 of FIG. 11. The second interlayer insulating layer 106 may include an insulating material. For example, the second interlayer insulating layer 106 may include silicon oxide, silicon nitride, silicon oxynitride, aluminum oxide, or the like.

The first connection electrode layer SD1 shown in FIG. 12 may be located on the second interlayer insulating layer 106.

The first connection electrode layer SD1 may include the second initialization voltage line VL, a horizontal connection line BRSH, and connection electrodes 171 to 178. The second initialization voltage line VL and the horizontal connection line BRSH may each have a shape substantially extending in the first direction (the x-axis direction). The connection electrodes 171 to 178 may each have an isolated shape.

The second initialization voltage line VL may be connected to the first semiconductor layer SACT through a contact hole 67 penetrating an insulating layer under the second initialization voltage line VL in the first pixel area PXA1, where the pixel circuit of the first pixel PX1 is arranged, and thus the second initialization voltage line VL may be electrically connected to the drain area of the second initialization transistor T8. The second initialization voltage line VL may have a curved shape and extend in a zigzag form in the first direction (the x-axis direction).

The horizontal connection line BRSH may be the first horizontal connection line DH1, the second horizontal connection line DH2, the third horizontal connection line DH3, the fourth horizontal connection line DH4, the first auxiliary horizontal connection line ADH1, the second auxiliary horizontal connection line ADH2, or the third auxiliary horizontal connection line ADH3 described above with reference to FIG. 3. That is, depending on the location of the horizontal connection line BRSH, the horizontal connection line BRSH may be the first horizontal connection line DH1, the second horizontal connection line DH2, the third horizontal connection line DH3, the fourth horizontal connection line DH4, the first auxiliary horizontal connection line ADH1, the second auxiliary horizontal connection line ADH2, or the third auxiliary horizontal connection line ADH3 described above with reference to FIG. 3.

An end of the connection electrode 171 may contact the second semiconductor layer OACT through a contact hole 51 and may be electrically connected to the second semiconductor layer OACT. In detail, the end of the connection electrode 171 may be electrically connected to the source area of the compensation transistor T3 and the drain area of the first initialization transistor T4 through the contact hole 51 penetrating insulating layers under the connection electrode 171. The other end of the connection electrode 171 may be electrically connected to the driving gate electrode 131a of the driving transistor T1 through a contact hole 52 penetrating the insulating layers under the connection electrode 171, wherein the driving gate electrode 131a also functions as the lower electrode of the storage capacitor Cst. Such a contact hole 52 may penetrate the opening SOP in the upper electrode of the storage capacitor Cst.

A connection electrode 172 may be electrically connected to the drain area of the driving transistor T1 and the source area of the emission control transistor T6 through a contact hole 53 penetrating insulating layers under the connection electrode 172. The connection electrode 172 may be electrically connected to the drain area of the compensation transistor T3 through a contact hole 54 penetrating insulating layers under the connection electrode 172.

A connection electrode 173 may be electrically connected to the source area of the switching transistor T2 through a contact hole 55 penetrating insulating layers under the connection electrode 173.

A connection electrode 174 may be electrically connected to the source area of the operation control transistor T5 through a contact hole 56 penetrating insulating layers under the connection electrode 174. Also, the connection electrode 174 may be electrically connected to the electrode voltage line HL through a contact hole 57 penetrating insulating layers under the connection electrode 174, wherein the electrode voltage line HL also functions as the upper electrode of the storage capacitor Cst.

A connection electrode 175 may be electrically connected to the first initialization voltage line VIL through a contact hole 58 penetrating insulating layers under the connection electrode 175. The connection electrode 175 may be electrically connected to the drain area of the first initialization transistor T4 through a contact hole 59 penetrating insulating layers under the connection electrode 175. Accordingly, a first initialization voltage that is a constant voltage may be applied to the semiconductor extension layer OACTE of the second semiconductor layer OACT.

A connection electrode 176 may electrically connect the first sub-semiconductor layer SACT1 to the second sub-semiconductor layer SACT2. In detail, the connection electrode 176 may be electrically connected to the source area of the driving transistor T1, the drain area of the operation control transistor T5, and the drain area of the switching transistor T2 through a contact hole 60 penetrating insulating layers under the connection electrode 176. The connection electrode 176 may be electrically connected to the drain area of the bias transistor T7 through a contact hole 61 penetrating insulating layers under the connection electrode 176.

A connection electrode 177 may be electrically connected to the drain area of the emission control transistor T6 through a contact hole 62 penetrating insulating layers under the connection electrode 177.

A connection electrode 178 may be electrically connected to the source area of the bias transistor T7 through a contact hole 65 penetrating insulating layers under the connection electrode 178. The connection electrode 178 may be electrically connected to the bias voltage line VBL through a contact hole 66 penetrating an insulating layer under the connection electrode 178.

The first connection electrode layer SD1 may include a metal, an alloy, conductive metal oxide, a transparent conductive material, or the like. For example, the first connection electrode layer SD1 may include Ag, an alloy containing Ag, Mo, an alloy containing Mo, Al, an alloy containing Al, AlN, W, WN, Cu, Ni, Cr, CrN, Ti, Ta, Pt, Sc, ITO, IZO, or the like. The first connection electrode layer SD1 may have a multilayered structure, for example, a two-layer structure of Ti/Al or a three-layer structure of Ti/Al/Ti.

A first planarization insulating layer (107, see FIG. 15) may cover the first connection electrode layer SD1 and may be located on the second interlayer insulating layer 106. The first planarization insulating layer 107 may include an organic insulating material. For example, the first planarization insulating layer 107 may include photoresist, benzocyclobutene (BCB), polyimide, hexamethyldisiloxane (HMDSO), polymethylmethacrylate (PMMA), polystyrene, a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, or any blend thereof.

A second connection electrode layer SD2 shown in FIG. 13 may be located over the first planarization insulating layer 107. The second connection electrode layer SD2 may include the data line DL, the driving voltage line PL, a vertical connection line BRSV, and a connection electrode 181. The data line DL, the driving voltage line PL, and the vertical connection line BRSV may substantially extend in the second direction (the y-axis direction).

The data line DL is electrically connected to the connection electrode 173, which is included in the first connection electrode layer SD1, through a contact hole 81 penetrating the first planarization insulating layer 107. As described above, the connection electrode 173 is connected to the source area of the switching transistor T2 through the contact hole 55 penetrating the insulating layers under the connection electrode 173, and the data line DL may be electrically connected to the source area of the switching transistor T2 accordingly.

The driving voltage line PL extending in the second direction (the y-axis direction) may be electrically connected to the connection electrode 174, which is included in the first connection electrode layer SD1, through a contact hole 82 penetrating the first planarization insulating layer 107. As described above, the connection electrode 174 is connected to the electrode voltage line HL, which is included in the second gate layer GTL2 and extends in the first direction (the x-axis direction), through the contact hole 57 penetrating the insulating layers under the connection electrode 174. Therefore, the driving voltage line PL and the electrode voltage line HL, which are electrically connected to each other, may have a mesh structure. Accordingly, an IR drop of the driving voltage ELVDD may be prevented or reduced in the display area DA.

The driving voltage line PL may include a plurality of first driving voltage branches PL1, a plurality of second driving voltage branches PL2, and a plurality of driving voltage bodies PL3.

The driving voltage bodies PL3 may be arranged in the second direction (the y-axis direction). The first driving voltage branches PL1 may each have a shape extending in the second direction (the y-axis direction). The first driving voltage branches PL1 may be arranged between the driving voltage bodies PL3 to connect the driving voltage bodies PL3 to each other. Accordingly, the first driving voltage branches PL1 and the driving voltage bodies PL3 may form the driving voltage line PL extending in the second direction (the y-axis direction).

The second driving voltage branches PL2 may each have a shape extending in the second direction (the y-axis direction). The second driving voltage branches PL2 may be arranged apart from the first driving voltage branches PL1 in the first direction (the x-axis direction). However, each of the second driving voltage branches PL2 does not connect the driving voltage bodies PL3 to each other. That is, an end of each of the second driving voltage branches PL2 (in the −y direction) is connected to its corresponding one of the driving voltage bodies PL3. However, the other ends of the second driving voltage branches PL2 (in the +y direction) are apart from the driving voltage bodies PL3.

The driving voltage line PL may include protrusions in addition to the first driving voltage branches PL1, the second driving voltage branches PL2, and the driving voltage bodies PL3. FIG. 13 shows that the protrusions include a first protrusion PL4 and a second protrusion PL5. Such protrusions may protrude from the driving voltage bodies PL3 in the second direction (the y-axis direction) to be arranged between the first driving voltage branches PL1 and the second driving voltage branches PL2. In detail, the first protrusion PL4 has a shape extending in the second direction (the y-axis direction) and has one end (in the −y direction) connected to the driving voltage body PL3. The second protrusion PL5 is connected to the other end of the first protrusion PL4 (in the +y direction). The second protrusion PL5 may have a shape extending in the first direction (the x-axis direction).

The vertical connection line BRSV may be the first vertical connection line DV1', the second vertical connection line DV2', the third vertical connection line DV3, the first additional vertical connection line DV1, the second additional vertical connection line DV2, the third additional vertical connection line DV3, the first auxiliary vertical connection line ADV1, the second auxiliary vertical connection line ADV2', the third auxiliary vertical connection line ADV3, the first auxiliary additional vertical connection line ADV1, the second auxiliary additional vertical connection line ADV2, or the third auxiliary additional vertical connection line ADV3 described above with reference to FIG. 3. That is, depending on the location of the vertical connection line BRSV, the vertical connection line BRSV may be the first vertical connection line DV1', the second vertical connection line DV2, the third vertical connection line DV3', the first additional vertical connection line DV1, the second additional vertical connection line DV2, the third additional vertical connection line DV3, the first auxiliary vertical connection line ADV1', the second auxiliary vertical connection line ADV2', the third auxiliary vertical connection line ADV3, the first auxiliary additional vertical connection line ADV1, the second auxiliary additional vertical connection line ADV2, or the third auxiliary additional vertical connection line ADV3 described above with reference to FIG. 3. The vertical connection line BRSV may be connected to the horizontal connection line BRSH, which is included in the first connection electrode layer SD1, through a contact hole, which is described above with reference to FIG. 3.

The connection electrode 181 is electrically connected to the connection electrode 177, which is included in the first connection electrode layer SD1, through a contact hole 83 penetrating the first planarization insulating layer 107. As described above, the connection electrode 177 may be electrically connected to the drain area of the emission control transistor T6. Therefore, the connection electrode 181 may be electrically connected to the drain area of the emission control transistor T6.

The second connection electrode layer SD2 may include a metal, an alloy, conductive metal oxide, a transparent conductive material, or the like. For example, the second connection electrode layer SD2 may include Ag, an alloy containing Ag, Mo, an alloy containing Mo, Al, an alloy containing Al, AlN, W, WN, Cu, Ni, Cr, CrN, Ti, Ta, Pt, Sc, ITO, IZO, or the like. The second connection electrode layer SD2 may have a multilayered structure, for example, a two-layer structure of Ti/Al or a three-layer structure of Ti/Al/Ti.

A second planarization insulating layer (108, see FIG. 15) may cover the second connection electrode layer SD2 and may be located on the first planarization insulating layer 107. The second planarization insulating layer 108 may include an organic insulating material. For example, the second planarization insulating layer 108 may include photoresist, BCB, polyimide, HMDSO, PMMA, polystyrene, a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, or any blend thereof.

A pixel electrode layer PXEL shown in FIG. 14 may be located over the second planarization insulating layer 108. The pixel electrode layer PXEL may include a plurality of pixel electrodes. FIG. 14 shows a pixel electrode PE1 of the first pixel PX1, a pixel electrode PE2 of the second pixel PX2, and a pixel electrode PE3 of the third pixel PX3. Each of the pixel electrodes PE1, PE2, and PE3 may include a first area corresponding to an emission area and a second area surrounding the first area.

The pixel electrode PE1 is electrically connected to the connection electrode 181 of the second connection electrode layer SD2 through a contact hole 91 penetrating the second planarization insulating layer 108. Accordingly, the pixel electrode PE1 may be electrically connected to the driving transistor T1 through the connection electrode 181 and the emission control transistor T6. The contact hole 91 may be arranged to correspond to the second area of the pixel electrode PE1

A pixel-defining layer 109 may be located on the second planarization insulating layer 108 to cover edges of the pixel electrode PE1 The pixel-defining layer 109 includes an opening corresponding to an emission area of each pixel and thus defines the pixels. For reference, the openings in the pixel-defining layer 109 are not shown in the cross-sectional view of FIG. 15. An emission layer may be arranged in the opening of the pixel-defining layer 109, and an opposite electrode CAT may be located on the emission layer. The pixel electrode PE1, the emission layer, and the opposite electrode CAT may form an organic light-emitting diode. The opposite electrode CAT may be integrally formed over a plurality of organic light-emitting diodes and thus may correspond to a plurality of pixel electrodes. For reference, at least one functional layer may be further arranged between the pixel electrode PE1 and the emission layer and/or the emission layer and the opposite electrode CAT. Such a functional layer may also be arranged between the pixel-defining layer 109 and the opposite electrode CAT.

In the case of the display apparatus according to some embodiments, the protrusion of the driving voltage line PL of the second connection electrode layer SD2 at least partially overlaps the horizontal connection line BRSH of the first connection electrode layer SD1. In detail, the second protrusion PL5 of the protrusion at least partially overlaps the horizontal connection line BRSH.

As described above, the pixel electrode PE1 is connected to the connection electrode 181, which is included in the second connection electrode layer SD2 located under the pixel electrode PE1, through a contact hole 91. A parasitic capacitance may exist between the connection electrode 181 and the horizontal connection line BRSH included in the first connection electrode layer SD1 under the connection electrode 181. As described above with reference to FIG. 3, because the horizontal connection line BRSH is connected to the data line DL and configured to transmit the data signal DATA, the data signal DATA may not be accurately transmitted because of the above parasitic capacitance, and thus, the quality of images displayed in the display area DA may degrade.

Figure 16:
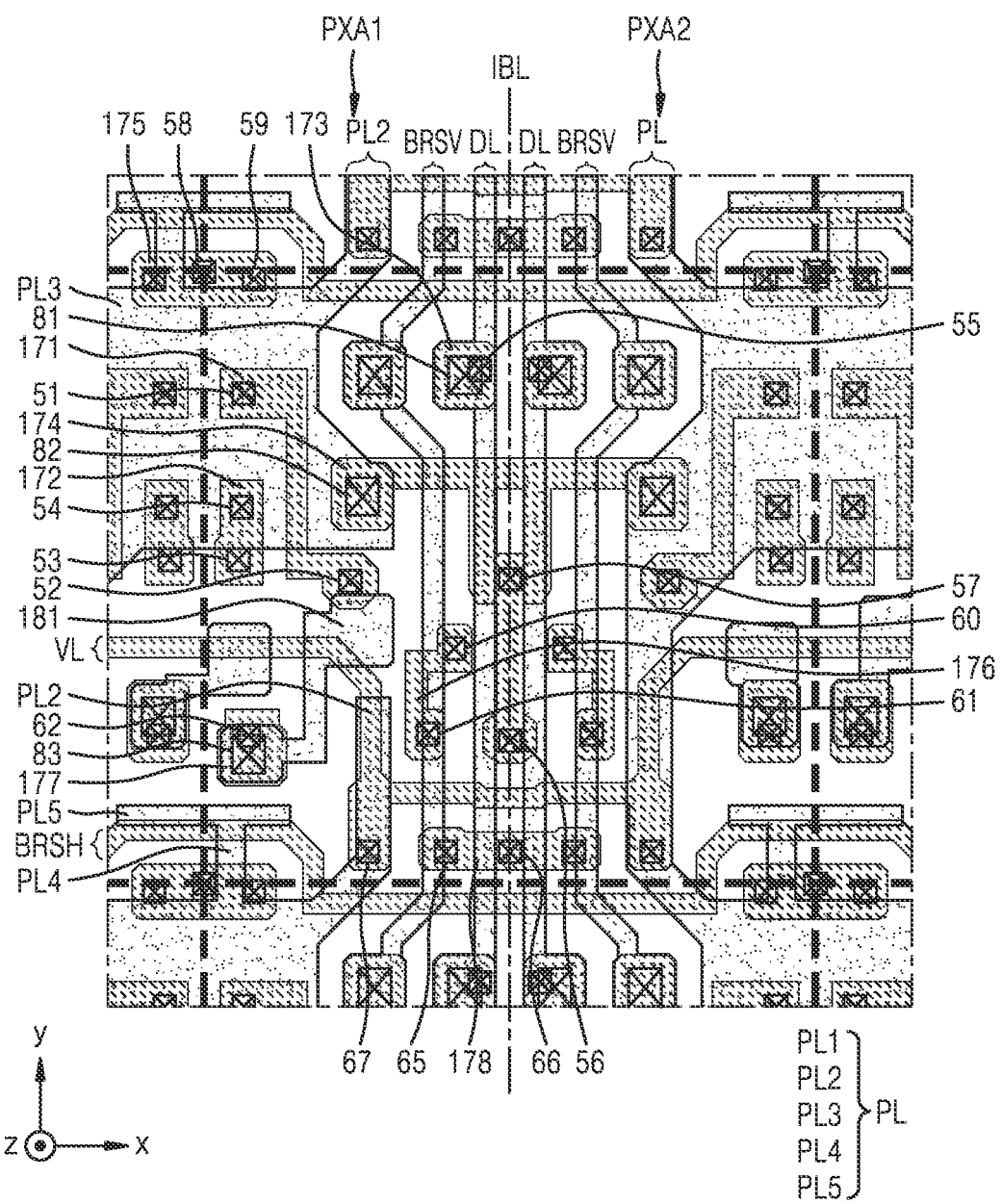
FIG. 16 is a layout in which FIGS. 12 and 13 overlap each other according to some embodiments.

However, in the case of the display apparatus according to some embodiments, the connection electrode 181 and the protrusion of the driving voltage line PL of the second connection electrode layer SD2 at least partially overlap the horizontal connection line BRSH included in the first connection electrode layer SD1. In detail, as shown in the layout of FIG. 16, in which FIG. 12 overlaps FIG. 13, and in the cross-sectional view of FIG. 15, the second protrusion PL5 of the protrusion at least partially overlaps the horizontal connection line BRSH. Because the second protrusion PL5 at least partially shields the horizontal connection line BRSH, and thus, the influence of the connection electrode 181 on the horizontal connection line BRSH may be prevented or reduced. Therefore, a display apparatus capable of displaying high-quality images may be realized. For example, because the protrusion receives the driving voltage ELVDD, which is the constant voltage, as a portion of the driving voltage line PL, the protrusion may effectively prevent or reduce instances of the horizontal connection line BRSH being affected by the connection electrode 181 or reduce the influence of the connection electrode 181.

For reference, when viewed in the direction perpendicular to the substrate 100 (e.g., in a plan view or a view that is normal with respect to the display surface), the center of the second protrusion PL5 in a widthwise direction (the y-axis direction) is between the center of the horizontal connection line BRSH in a widthwise direction (the y-axis direction) and the connection electrode 181, and thus, the shielding effect may be improved.

As described above, an end of the second driving voltage branch PL2 (in the −y direction) extending in the second direction (the y-axis direction) is connected to its corresponding one of the driving voltage bodies PL3, but the other end of the second driving voltage branch PL2 is apart from the driving voltage bodies PL3. Accordingly, there may be a space between the other end of the second driving voltage branch PL2 and the driving voltage body PL3, and the connection electrode 181 included in the second connection electrode layer SD2 may have a portion located in the above space together with the driving voltage line PL. Because the pixel electrode PE1 is connected to the connection electrode 181 through the contact hole 91, the contact hole 91 may be located in the portion of the connection electrode 181 that is in the space.

Similar to the first driving voltage branch PL1, when an end and the other end of the second driving voltage branch PL2 are connected to the driving voltage bodies PL3, and when viewed in the direction perpendicular to the substrate 100, the connection electrode 181 may be entirely arranged between the first driving voltage branch PL1 and the second driving voltage branch PL2 and closer to the horizontal connection line BRSH. In this case, the parasitic capacitance between the connection electrode 181 and the horizontal connection line BRSH increases, and thus, the quality of images displayed in the display area DA may degrade as described above.

However, in the display apparatus according to some embodiments, the other end of the second driving voltage branch PL2 (in the +y direction) may be apart from the driving voltage bodies PL3, and thus, a portion of the connection electrode 181, which is connected to the pixel electrode PE1 and corresponds to the contact hole 91, may be located in the space between the other end of the second driving voltage branch PL2 and the driving voltage bodies PL3, the space being generated because of the separation of the other end of the second driving voltage branch PL2 (in the +y direction) and the driving voltage bodies PL3. Accordingly, the distance between the horizontal connection line BRSH and the connection electrode 181 may increase, and thus, a display apparatus capable of displaying high-quality images may be realized.

As described above, the lower gate line GIL1 (of the third scan line GIL) including the first initialization gate electrode of the first initialization transistor T4 is located in the second gate layer GTL2. Because the lower gate line GIL1 includes the first initialization gate electrode, the lower gate line GIL1 may be referred to as an initialization gate line. The parasitic capacitance may exist between the lower gate line GIL1 and the horizontal connection line BRSH included in the first connection electrode layer SD1. As described above with reference to FIG. 3, because the horizontal connection line BRSH is connected to the data line DL and configured to transmit the data signal DATA, the data signal DATA may not be accurately transmitted because of the parasitic capacitance, and thus, the quality of images displayed in the display area DA may degrade.

For example, the lower gate line GIL1 extending in the first direction (the x-axis direction) periodically turns on or off the first initialization transistor T4. Thus, electrical signals periodically changing flow in the lower gate line GIL1. Therefore, the horizontal connection line BRSH, which is located at a different layer from the lower gate line GIL1, is adjacent to the lower gate line GIL1 in a plan view, and extends in the first direction (the x-axis direction), is electrically affected by the lower gate line GIL1. As described above, the horizontal connection line BRSH is electrically connected to the data line DL and configured to transmit the data signal DATA to the data line DL, according to the location of the horizontal connection line BRSH in the display area DA. When the horizontal connection line BRSH is periodically electrically affected by the lower gate line GIL1, the data line DL electrically connected to the horizontal connection line BRSH may also periodically be electrically influenced by the lower gate line GIL1. Such electrical influence eventually causes an unintended brightness change in pixels connected to the data line DL so that the degradation in the image quality of the display apparatus may occur.

Figure 17:
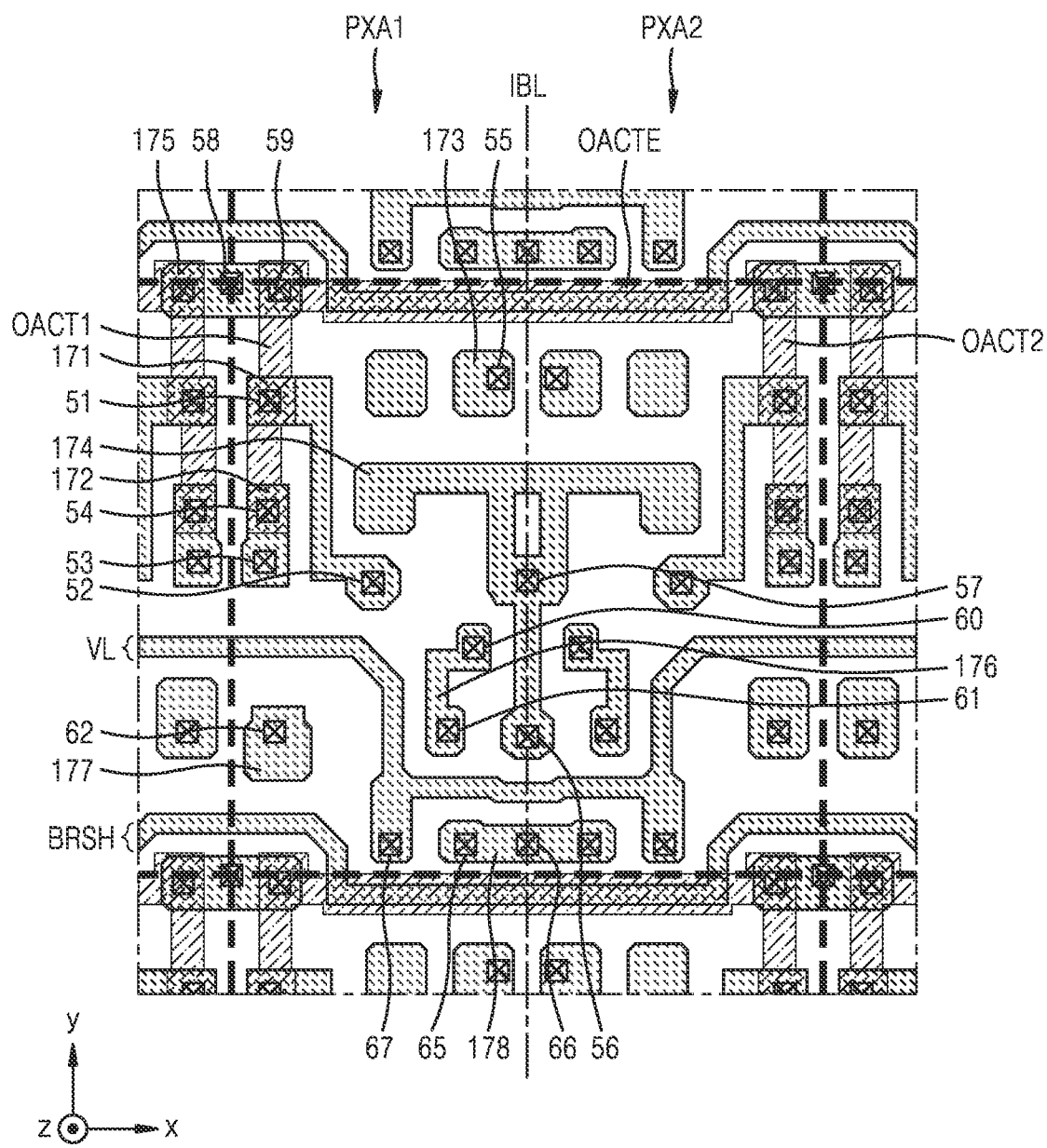
FIG. 17 is a layout in which FIGS. 10 and 12 overlap each other according to some embodiments.

However, in the display apparatus according to some embodiments, the second semiconductor layer OACT includes the semiconductor extension layer OACTE extending in the first direction (the x-axis direction) as described above. The semiconductor extension layer OACTE overlaps a portion of the horizontal connection line BRSH included in the first connection electrode layer SD1 located over the semiconductor extension layer OACTE. In the layout of FIG. 17 in which FIGS. 10 and 12 overlap each other, when viewed in the direction perpendicular to the substrate 100, a portion of the horizontal connection line BRSH, which overlaps the semiconductor extension layer OACTE, is located in the semiconductor extension layer OACTE.

In the case of the display apparatus according to some embodiments, the semiconductor extension layer OACTE may shield the horizontal connection line BRSH from the lower gate line GIL1 (of the third scan line GIL). Accordingly, the influence of the lower gate line GIL1 on the horizontal connection line BRSH may be prevented or reduced. To this end, a display apparatus capable of displaying a high-quality image may be realized. For example, the semiconductor extension layer OACTE may be electrically connected to the first initialization voltage line VIL by the connection electrode 175 included in the first connection electrode layer SD1. Accordingly, because the first initialization voltage that is the constant voltage is applied to the semiconductor extension layer OACTE, the influence of the lower gate line GIL1 on the horizontal connection line BRSH may be effectively prevented or reduced.

As described above, the fourth scan line GBL including the bias gate electrode of the bias transistor T7 is in the first gate layer GTL1. The parasitic capacitance may exist between the fourth scan line GBL and the horizontal connection line BRSH included in the first connection electrode layer SD1. As described above with reference to FIG. 3, because the horizontal connection line BRSH is connected to the data line DL and configured to transmit the data signal DATA, the data signal DATA may not be accurately transmitted because of the parasitic capacitance, and thus, the quality of images displayed in the display area DA may degrade.

For example, the fourth scan line GBL extending in the first direction (the x-axis direction) periodically turns on or off the bias transistor T7. Thus, electrical signals periodically changing flow in the fourth scan line GBL. Therefore, the horizontal connection line BRSH, which is located at a different layer from the fourth scan line GBL, is adjacent to the fourth scan line GBL in a plan view, and extends in the first direction (the x-axis direction), is electrically affected by the fourth scan line GBL. As described above, the horizontal connection line BRSH is electrically connected to the data line DL and configured to transmit the data signal DATA to the data line DL, according to the location of the horizontal connection line BRSH in the display area DA. When the horizontal connection line BRSH is periodically electrically affected by the fourth scan line GBL, the data line DL electrically connected to the horizontal connection line BRSH may also periodically be electrically influenced by the fourth scan line GBL. Such electrical influence eventually causes an unintended brightness change in pixels connected to the data line DL so that the degradation in the image quality of the display apparatus may occur.

Figure 18:
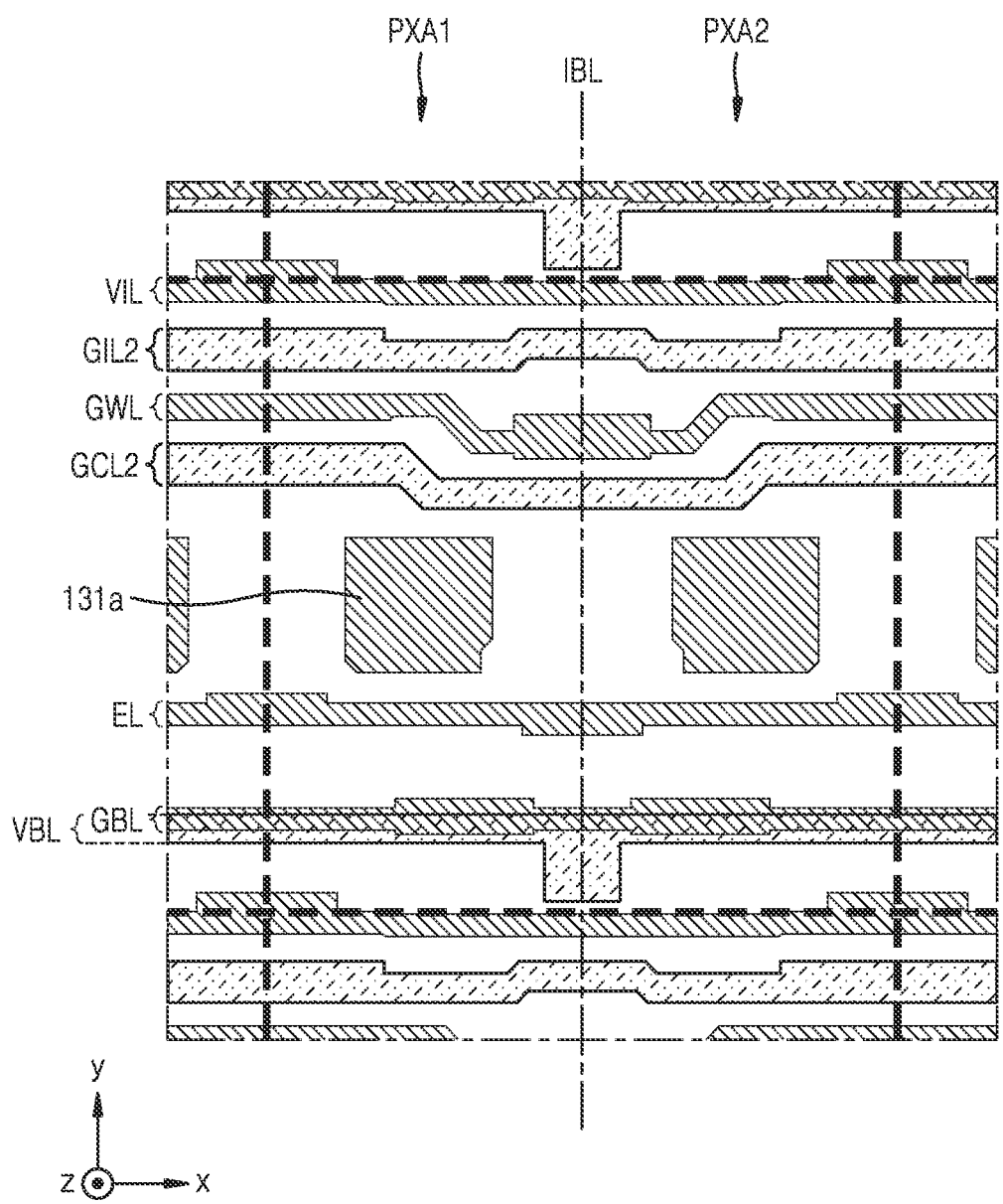
FIG. 18 is a layout in which FIGS. 8 and 11 overlap each other according to some embodiments.

As shown in the layout of FIG. 18, in which FIG. 8 overlaps FIG. 11, and the cross-sectional view of FIG. 15, in the display apparatus according to some embodiments, the bias voltage line VBL, which is included in the third gate layer GTL3 and extends in the first direction (the x-axis direction), overlaps the fourth scan line GBL that may be referred to as a bias gate line.

In the case of the display apparatus according to some embodiments, the bias voltage line VBL may shield the fourth scan line GBL. Accordingly, it may be possible to prevent or reduce instances of the horizontal connection line BRSH being affected by the fourth scan line GBL or reduce the influence of the fourth scan line GBL. To this end, a display apparatus capable of displaying a high-quality image may be realized. For example, because the bias voltage VOBS that is a constant voltage is applied to the bias voltage line VBL, it may be possible to effectively prevent or reduce the influence of the fourth scan line GBL on the horizontal connection line BRSH. For reference, when viewed in the direction perpendicular to the substrate 100, the center of the bias voltage line VBL in the widthwise direction (the y-axis direction) is located between the center of the horizontal connection line BRSH in the widthwise direction (the y-axis direction) and the center of the fourth scan line GBL in the widthwise direction (the y-axis direction), and thus, a shielding effect may be improved.

According to the one or more embodiments, a display apparatus capable of displaying high-quality images may be realized. However, the scope of embodiments according to the present disclosure is not limited by the effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:
1. A display apparatus comprising:
 a first connection electrode layer on a substrate and comprising a horizontal connection line extending in a first direction; and a second connection electrode layer on the first connection electrode layer, comprising a vertical connection line extending in a second direction crossing the first direction and a driving voltage line extending in the second direction, the driving voltage line comprising a protrusion overlapping the horizontal connection line, wherein the driving voltage line comprises:
a first driving voltage branch extending in the second direction;
a second driving voltage branch extending in the second direction and spaced apart from the first driving voltage branch in the first direction; and
a driving voltage body connected to the first driving voltage branch and the second driving voltage branch,
wherein the protrusion protrudes from the driving voltage body in the second direction to be arranged between the first driving voltage branch and the second driving voltage branch.

2. The display apparatus of claim 1, wherein the protrusion comprises:
a first protrusion which has one end connected to the driving voltage body and extends in the second direction; and
a second protrusion connected to another end of the first protrusion and extending in the first direction.

3. The display apparatus of claim 2, wherein the second protrusion overlaps the horizontal connection line.

4. The display apparatus of claim 1, wherein the driving voltage line comprises:
a plurality of driving voltage bodies arranged in the second direction;
a plurality of first driving voltage branches extending in the second direction and arranged between the plurality of driving voltage bodies to connect the plurality of driving voltage bodies to each other; and
a plurality of second driving voltage branches spaced apart from the plurality of first driving voltage branches in the first direction,
wherein each of the plurality of second driving voltage branches has an end connected to a corresponding one of the plurality of driving voltage bodies.

5. The display apparatus of claim 4, wherein another end of each of the plurality of second driving voltage branches is spaced apart from the plurality of driving voltage bodies.

6. The display apparatus of claim 5, wherein the second connection electrode layer further comprises connection electrodes spaced apart from the driving voltage line, each of the connection electrodes comprising a portion arranged between the another end of a corresponding one of the plurality of second driving voltage branches and a corresponding one of the plurality of driving voltage bodies.

7. The display apparatus of claim 6, further comprising pixel electrodes on the second connection electrode layer, each of the pixel electrodes being electrically connected to a corresponding one of the connection electrodes through a contact hole.

8. A display apparatus comprising:
a first semiconductor layer on a substrate;
a first gate layer on the first semiconductor layer and comprising a driving gate electrode;
a second gate layer on the first gate layer and comprising an initialization gate line extending in a first direction;
a second semiconductor layer on the second gate layer and comprising a $2^{nd}$-$1^{st}$ semiconductor layer extending in a second direction crossing the first direction and a semiconductor extension layer extending from the $2^{nd}$-$1^{st}$ semiconductor layer in the first direction;
a first connection electrode layer on the second semiconductor layer and comprising a horizontal connection line extending in the first direction and comprising a portion overlapping the semiconductor extension layer; and
a second connection electrode layer on the first connection electrode layer and
comprising a vertical connection line extending in the second direction and a driving voltage line extending in the second direction,
wherein the first gate layer further comprises an initialization voltage line extending in the first direction and the semiconductor extension layer is electrically connected to the initialization voltage line.

9. The display apparatus of claim 8, wherein the first connection electrode layer further comprises a connection electrode connected to the initialization voltage line and the semiconductor extension layer through contact holes.

10. The display apparatus of claim 8, wherein the $2^{nd}$-$1^{st}$ semiconductor layer and the semiconductor extension layer are integrally formed as a single body and comprise oxide semiconductor materials.

11. The display apparatus of claim 8, wherein the second semiconductor layer further comprises a $2^{nd}$-$2^{nd}$ semiconductor layer extending in the second direction, and an end of the semiconductor extension layer is connected to the $2^{nd}$$1^{st}$ semiconductor layer and another end of the semiconductor extension layer is connected to the $2^{nd}$-$2^{nd}$ semiconductor layer.

12. The display apparatus of claim 8, wherein a portion of the horizontal connection line, which overlaps the semiconductor extension layer, is in the semiconductor extension layer, in a plan view.

13. A display apparatus comprising:
a first semiconductor layer on a substrate;
a first gate layer on the first semiconductor layer and comprising a driving gate electrode and a bias gate line extending in a first direction;
a second gate layer on the first gate layer and comprising an initialization gate line extending in the first direction;
a third gate layer on the second gate layer and comprising a bias voltage line extending in the first direction and overlapping the bias gate line;
a first connection electrode layer on the third gate layer and comprising a horizontal connection line extending in the first direction; and
a second connection electrode layer on the first connection electrode layer and
comprising a vertical connection line extending in a second direction and a driving voltage line extending in the second direction,
wherein the first connection electrode layer further comprises a connection electrode connected to the bias voltage line and the first semiconductor layer through contact holes.

* * * * *